(12) United States Patent
Hebishima

(10) Patent No.: US 7,405,976 B2
(45) Date of Patent: Jul. 29, 2008

(54) NONVOLATILE SEMICONDUCTOR MEMORY AND METHOD FOR CONTROLLING THE SAME

(75) Inventor: Hirofumi Hebishima, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 126 days.

(21) Appl. No.: 11/410,136

(22) Filed: Apr. 25, 2006

(65) Prior Publication Data

US 2006/0245253 A1 Nov. 2, 2006

(30) Foreign Application Priority Data

Apr. 27, 2005 (JP) ............................ 2005-128880

(51) Int. Cl.
*G11C 16/06* (2006.01)

(52) U.S. Cl. ............................ 365/185.22; 365/185.03; 365/185.11; 365/185.28; 365/185.29

(58) Field of Classification Search ............ 365/185.03, 365/185.11, 185.22, 185.28, 185.29
See application file for complete search history.

(56) References Cited

U.S. PATENT DOCUMENTS 6,601,132 B2   7/2003   Nomura et al. ............. 711/103
6,917,543 B2   7/2005   Sato ....................... 365/185.22

FOREIGN PATENT DOCUMENTS

JP   6-195989 A   7/1994
JP   2002-366420 A   12/2002

*Primary Examiner*—Hoai V Ho
(74) *Attorney, Agent, or Firm*—Sughrue Mion, PLLC

(57) ABSTRACT

A nonvolatile semiconductor memory includes a memory cell array, a flag information storage that stores a write flag indicating success/failure of writing in association with each address of a plurality of data segments contained in the data block, an internal address storage that selects the address where the writing has failed, a write circuit that performs data writing, a comparator that performs verify operation to verify success/failure of the data writing, and a sequence controller that updates a write flag according to the result of the verify operation.

4 Claims, 21 Drawing Sheets

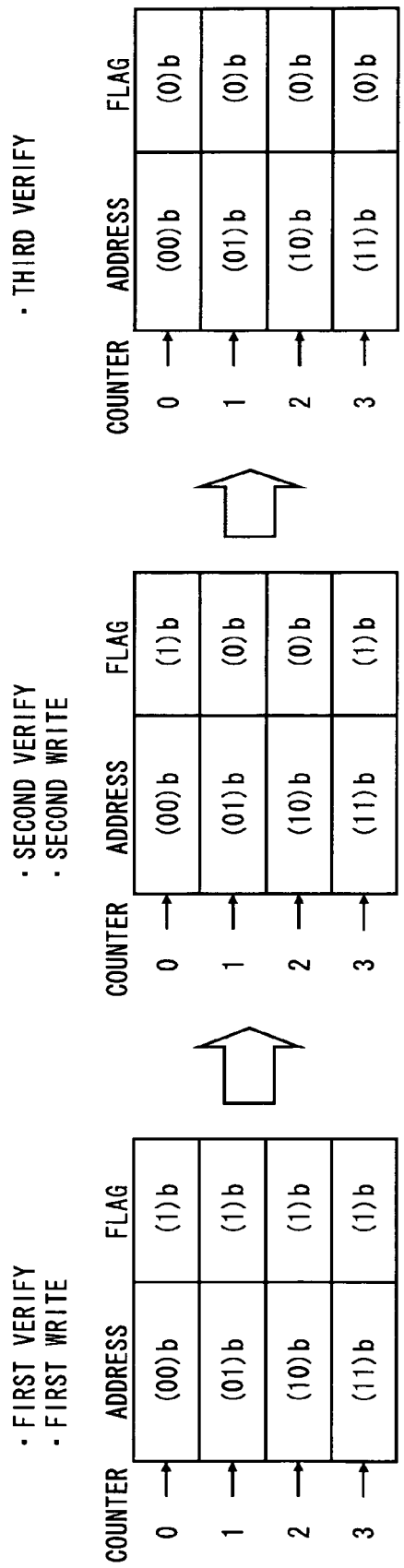

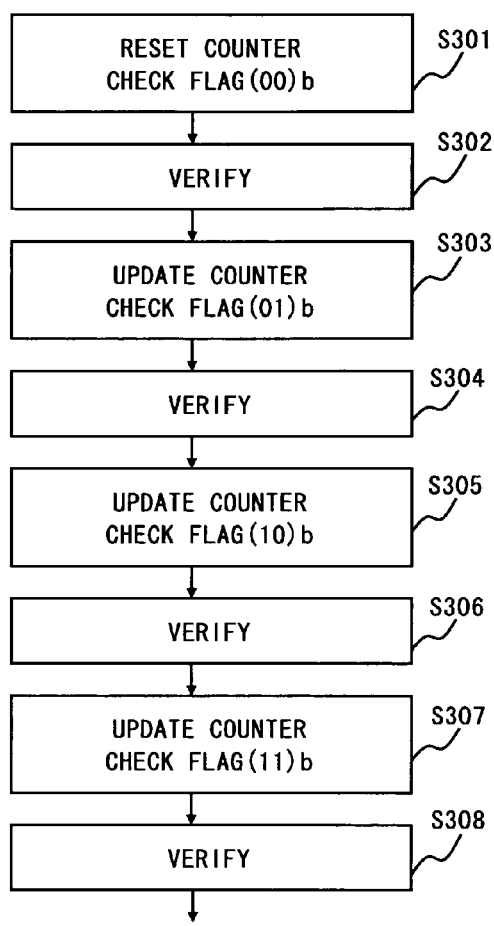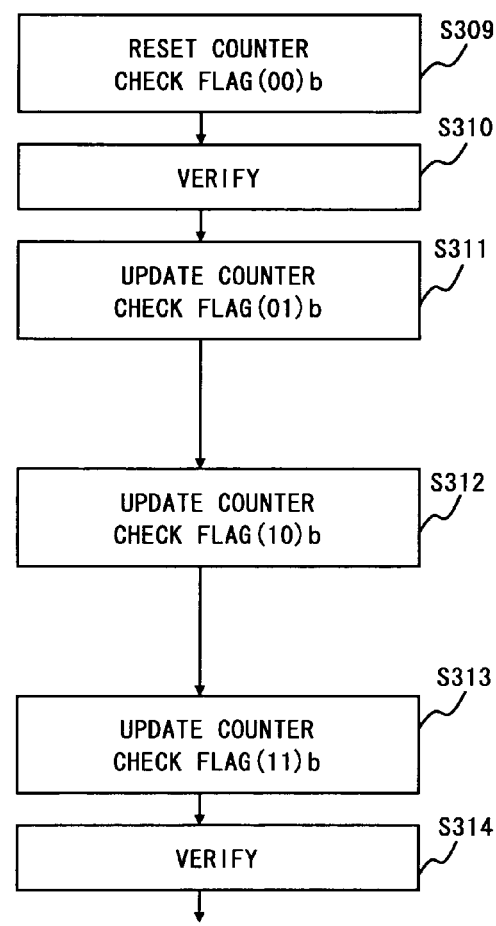
Fig. 5A                    Fig. 5B

NONVOLATILE SEMICONDUCTOR MEMORY AND METHOD FOR CONTROLLING THE SAME

BACKGROUND OF THE INVENTION

1. Field of the Invention

The present invention relates generally to a nonvolatile semiconductor memory and a method for controlling the same and more particularly to a nonvolatile semiconductor memory that performs writing and erasing in units of a plurality of memory cells (data) and a method for controlling the same.

2. Description of Related Art

Electrically Erasable and Programmable ROM (EEPROM) is widely known as a nonvolatile memory which is electrically erasable and programmable. A flash memory, which is one type of EEPROM and erasable in units of blocks, has a significantly increasing memory capacity and gains attention as a memory to substitute for a disc or the like.

In the flash memory, a memory cell is composed of a transistor having a floating gate and a control gate. Data is recorded by electrically writing data on the memory cell transistor. Data is erased by electrically erasing data on the memory cell transistor.

In the electrical writing on the memory cell transistor, a high voltage for writing is applied to the control gate and the drain of the memory cell transistor. Electrons are thereby injected to the floating gate, setting a threshold of the memory cell transistor to be higher.

For example, as shown in FIG. 17, a flash memory which switches the threshold of the memory cell transistor between two levels by one-time electrical writing and stores the data of "0" and "1" in one memory cell transistor is called a binary flash memory. As shown in FIG. 18, a flash memory which switches the threshold of the memory cell transistor among a plurality of levels by a plurality of times of electrical writing and stores a plurality of data segments such as the data of "0", "1", "2" and "3" in one memory cell transistor is called a multivalued flash memory. Though the use of the multivalued flash memory allows an increase in memory capacity, it increases the number of writing times accordingly. For instance, the flash memory of FIG. 18 requires three times of writing in order to change the state of the memory cell transistor from the state storing the data "3" to the state storing the data "0".

Further, after writing data to the memory cell transistor, the read operation called "verify" is performed in order to verify that the threshold of the memory cell transistor reaches a target value. Thus, the data write operation is implemented by automatically repeating the electrical writing and the verify operation (automatic writing) and it is necessary to provide a device for controlling the repetition for every target memory cell. Similarly in the data erase operation, it is necessary to provide an automatic erase control device which automatically repeats the electrical erasing and the verify operation for every target memory cell.

In this way, recording and erasing of data on the flash memory requires sequence control such as automatic writing or automatic erasing. Reduction of the processing time by using a suitable flow is one factor to determine the commercial value.

FIG. 19 shows the structure of a nonvolatile semiconductor memory of a related art. As shown in FIG. 19, the nonvolatile semiconductor memory includes a buffer 901 that latches an external address or external data supplied from outside, a sequence controller 904 that controls a write sequence, a memory cell array 907 that has memory cells arranged in array, a read circuit 905 that reads data from the memory cell array 907, a write circuit 906 that writes data to the memory cell array 907, and a comparator 909 that compares the data read from the memory cell array 907 with external data.

The flowchart of FIG. 20 shows an automatic write operation in the nonvolatile semiconductor memory of a related art. The automatic write operation is implemented by the control of the sequence controller 904.

Initially, one external address and one external data to be written are input as a command through an external bus or the like and stored in the buffer 901 (S901). Then, the read circuit 905 performs the read operation on the memory cell of the memory cell array 907 which is specified by the external address under the control of the sequence controller 904 (S902). Then, the comparator 909 determines whether the read data corresponds to the input external data (S903). The process of the steps S902 and S903 is the verify operation.

If it is determined in the step S903 that the data correspond to each other, the sequence controller 904 terminates the automatic write operation. If, on the other hand, it is determined in the step S903 that the data does not correspond, the write circuit 906 performs the write operation of the external data into the memory cell of the memory cell array 907 which is specified by the external address under the control of the sequence controller 904 (S904). After that, the process further performs the verify operation (S902 and S903), and repeats the write operation and the verify operation until the data of the memory cell corresponds to the external data.

Japanese Unexamined Patent Application Publications Nos. 2002-366420 and H6-195989 include the disclosure concerning a nonvolatile semiconductor memory. The technique disclosed therein sets a flag that indicates the completion of erasing for each block or sector.

However, since the conventional nonvolatile semiconductor memory inputs a command (one address and one data) from the outside with respect to each writing or erasing on one address, it has a disadvantage of a low processing efficiency of writing or erasing to take a long time for the write and erase operation.

FIG. 21 shows the operation of writing a plurality of data segments in chronological order in the conventional nonvolatile semiconductor memory. This is the case where the verify succeeds in one-time writing.

In order to write first data, the operation first inputs one address and one data in T101. Then, it performs the verify before writing (pre-verify) in T102, writes one data in the memory cell of one address in T103, and then performs the verify after writing (post-verify) in T104. The writing of the first data thereby completes. Then, in order to write second data, the operation further inputs one address and one data and writes the data in the same manner as above. The operation of T101 to T104 is repeated for the number of data segments to be written.

Therefore, even in the case where it is possible to identify other addresses with one address such as when writing a large amount of data to successive addresses, it is necessary to input an address and data each time for every address of data to be written, thus forcing to perform the input operation in vain.

External commands are input from CPU or the like through a bus. With the recent increase in processing speed of CPU and bus, transfer speed and capacity, a large amount of successive data segments are input in many cases. Thus, the useless processing for each address causes significant deterioration in the overall efficiency and processing time of the data write or erase operation.

SUMMARY OF THE INVENTION

According to one aspect of the present invention, there is provided a nonvolatile semiconductor memory that has a sector containing a plurality of memory cells as a minimum unit of data erase operation, which includes an input section for batch-inputting data segments to be written to a plurality of addresses in the sector, a flag storage for storing states of the memory cells respectively corresponding to the plurality of addresses, and an address setting circuit for determining an address to be selected according to information in the flag storage.

The nonvolatile semiconductor memory performs batch input of a plurality of addresses and data segments, thereby eliminating the need for inputting a command for each of a plurality of addresses. It is thereby possible to improve the write/erase operation efficiency and reduce the processing time. Further, by setting a flag for each address, it is possible to perform the data write/erase operation on a memory cell more efficiency compared with the case of setting a flag for each sector.

According to another aspect of the present invention, there is provided a nonvolatile semiconductor memory that performs write/erase operation in units of data block containing a plurality of data segments, which includes a memory cell array including a plurality of nonvolatile memory cells, a flag storage for storing a flag provided for each address and indicating success/failure of the write/erase operation in association with each address of the plurality of data segments contained in the data block, an address selector for selecting the address where the write/erase operation has failed according to the stored flag, a writing/erasing section for performing the write/erase operation of the data segments on the nonvolatile memory cell located in the selected address, a verify section for performing verify operation to verify success/failure of the data write/erase operation on the nonvolatile memory cell located in the selected address, and a flag update section for updating the flag according to a result of the verify operation.

The nonvolatile semiconductor memory performs writing and erasing in units of a plurality of data segments, thereby eliminating the need for inputting a command for each of a plurality of addresses. It is thereby possible to improve the writing and erasing processing efficiency and reduce the processing time. Further, by setting a flag for each address where data is to be written or erased, it is possible to perform writing and erasing more efficiency compared with the case of setting a flag for a unit of a plurality of data segments.

The present invention provides a nonvolatile semiconductor memory capable of improving writing and erasing processing efficiency and reducing a writing and erasing processing time and a method for controlling the same.

BRIEF DESCRIPTION OF THE DRAWINGS

The above and other objects, advantages and features of the present invention will be more apparent from the following description taken in conjunction with the accompanying drawings, in which:

FIGS. 4A to 4C are views showing an example of a write flag used in a nonvolatile semiconductor memory according to an embodiment of the present invention;

FIGS. 5A and 5B are flowcharts showing write operation of a nonvolatile semiconductor memory according to an embodiment of the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A nonvolatile semiconductor memory according to a first embodiment of the present invention is described hereinafter. The nonvolatile semiconductor memory of this embodiment allows batch input of data segments with successive addresses. Further, it sets a flag indicating completion of writing for each address so that a counter sequentially selects and processes each flag.

Figure 1:
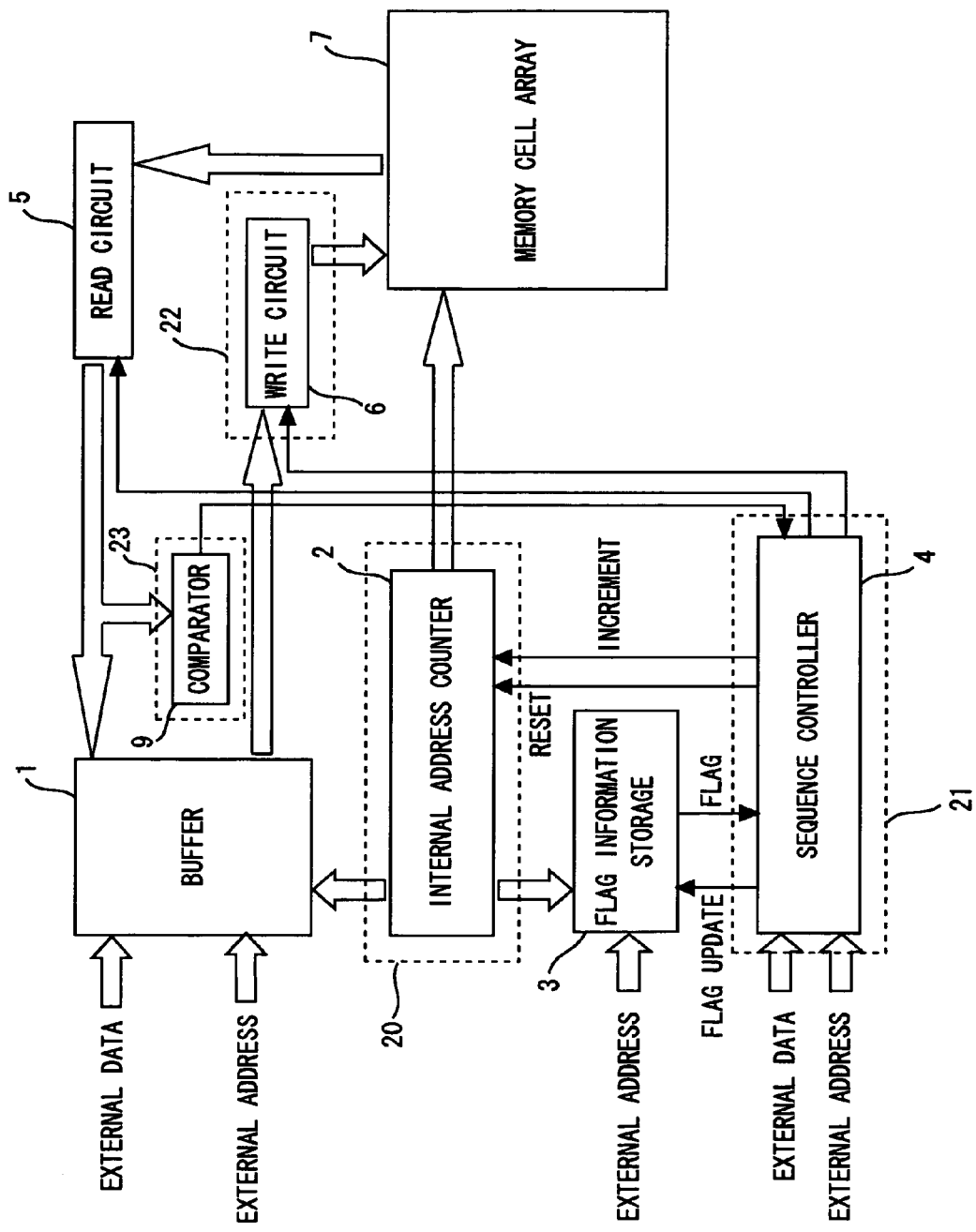
FIG. 1 is a block diagram showing the structure of a nonvolatile semiconductor memory according to an embodiment of the present invention.

Referring first to FIG. 1, the structure of the nonvolatile semiconductor memory according to this embodiment is described hereinafter. The nonvolatile semiconductor memory is a semiconductor device including a flash memory and a controller, for example, and temporarily stores a sequence of data to be written in a buffer and then sequentially writes the data.

As shown in FIG. 1, the nonvolatile semiconductor memory includes a buffer 1, an internal address counter 2, a flag information storage 3, a sequence controller 4, a read circuit 5, a write circuit 6, a memory cell array 7 and a comparator 9.

The buffer 1 temporarily stores an external address and external data supplied through an external bus or the like. The external address and external data are the address and data to be written. Particularly, in this embodiment, the external data is a data block containing a plurality of successive data segments and the external address is a top address of the data block of the external data. Thus, the buffer 1 serves as an input section that inputs at a time the data segments to be written to a plurality of addresses in a sector.

The internal address counter 2 selects an internal address where data to be written or read from the memory cell array 7 according to a counter value. The internal address counter 2 is an address setting circuit (address selector) 20 that determines an address to be supplied to the memory array 7 according to a write flag stored in the flag information storage 3. For example, the counter value may be an internal address or an offset from the top address. The internal address is an address to specify the memory cell in the memory cell array 7, and it may be the same as the external address supplied from the outside or an address converted from the external address for writing to the memory cell array 7. One of the external addresses always corresponds to one of the internal addresses.

The flag information storage (flag storage) 3 stores a write flag for each address of external data (each internal address) stored in the buffer 1. The write flag is stored in association with the address of the memory cell (data) in the memory cell array 7 and it indicates the state of each memory cell (data). The write flag indicates the success or failure of writing of each data, that is, indicates if writing has completed for each data. If the write flag is set, it indicates the writing failed, which means it is a target for writing. If, on the other hand, the write flag is not set or reset, it indicates the writing succeeded, which means it is not a target for writing.

In the memory cell array 7, a plurality of memory cells are arranged in array. The memory cells are nonvolatile memory cells such as a flash memory. For example, the memory cell array 7 may be divided into several sectors each having a plurality of memory cells and being a minimum unit for erasing. The read circuit 5 reads the data from the memory cell in the memory cell array 7 which has the internal address selected by the internal address counter 2. The write circuit 6 writes the external data stored in the buffer 1 to the memory cell in the memory cell array 7 which has the internal address selected by the internal address counter 2. Thus, the write circuit 6 is a writing or erasing section 22 that performs data write or read operation on the memory cell. The comparator 9 compares the data read from the memory cell array 7 by the read circuit 5 with the external data stored in the buffer 1. Thus, the comparator 9 is a verify section 23 that performs verify operation for determining if the data write or erase operation is succeeded or failed.

The sequence controller 4 controls the operation of each component and implements a sequence of automatic write operation. The sequence controller 4 also serves as a flag updating section 21 for updating a write flag according to the verify result of the comparator 9. For example, the sequence controller 4 operates the read circuit 5 or the write circuit 6 according to the write flag in the flag information storage 3, updates the write flag in the flag information storage 3 according to the comparison result in the comparator 9 and updates the counter value of the internal address counter 2.

The sequence controller 4 includes a command decoder. The command decoder recognizes a command for automatic input operation, enabling continuous inputs of write addresses and write data.

Figure 2:
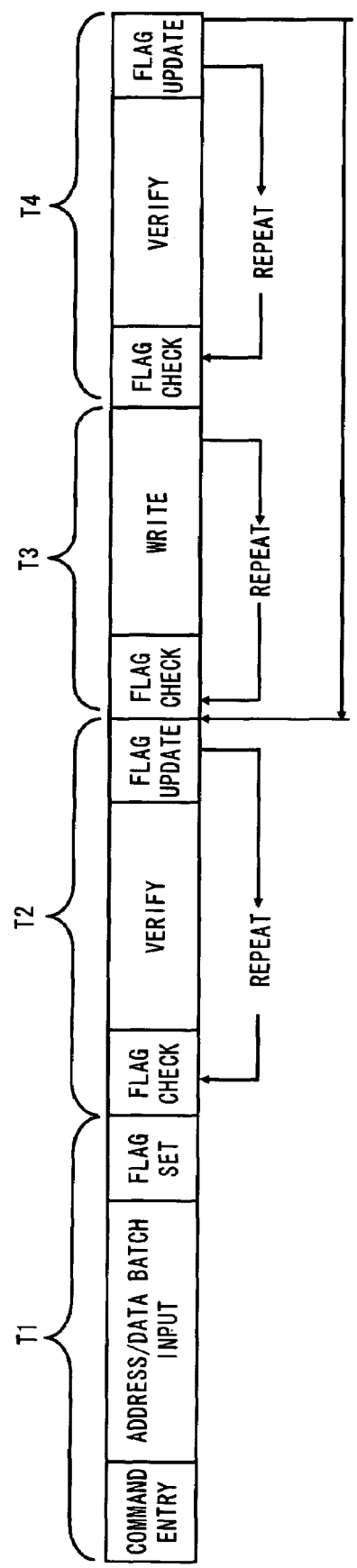
FIG. 2 is a view to describe the flow of write operation of a nonvolatile semiconductor memory according to an embodiment of the present invention.

Referring next to FIG. 2, the automatic write operation of the nonvolatile semiconductor memory according to this embodiment is described schematically. FIG. 2 shows the flow of data write operation in chronological order. It shows the case where the verify succeeds in one-time writing.

In T1, the operation inputs an address and data at a time after decoding the command indicating the automatic write operation. Thus, a plurality of data segments and a top address are input and stored in the buffer 1. At the same time, the operation sets a write flag corresponding to each address to the flag information storage 3.

In T2, the operation checks the write flag in the flag information storage 3 and performs the verify before writing (pre-verify) according to the flag and then, in accordance with the verify result, updates the flag. The verify operation is repeated for the number of addresses where the write flag is set.

In T3, the operation checks the write flag in the flag information storage 3 and writes the data in the buffer 1 into the memory cell of the memory cell array 7 according to the flag. The write operation is repeated for the number of addresses where the write flag is set.

In T4, the operation checks the write flag in the flag information storage 3 and performs the verify after writing (post-verify) according to the flag and then, in accordance with the verify result, updates the flag. The verify operation is repeated for the number of addresses where the write flag is set. Further, if the address where writing has been failed, which is the address where the write flag is set, remains after the verify, the write operation in T3 and the verify operation in T4 are repeated until the writing is all succeeded.

Figure 21:
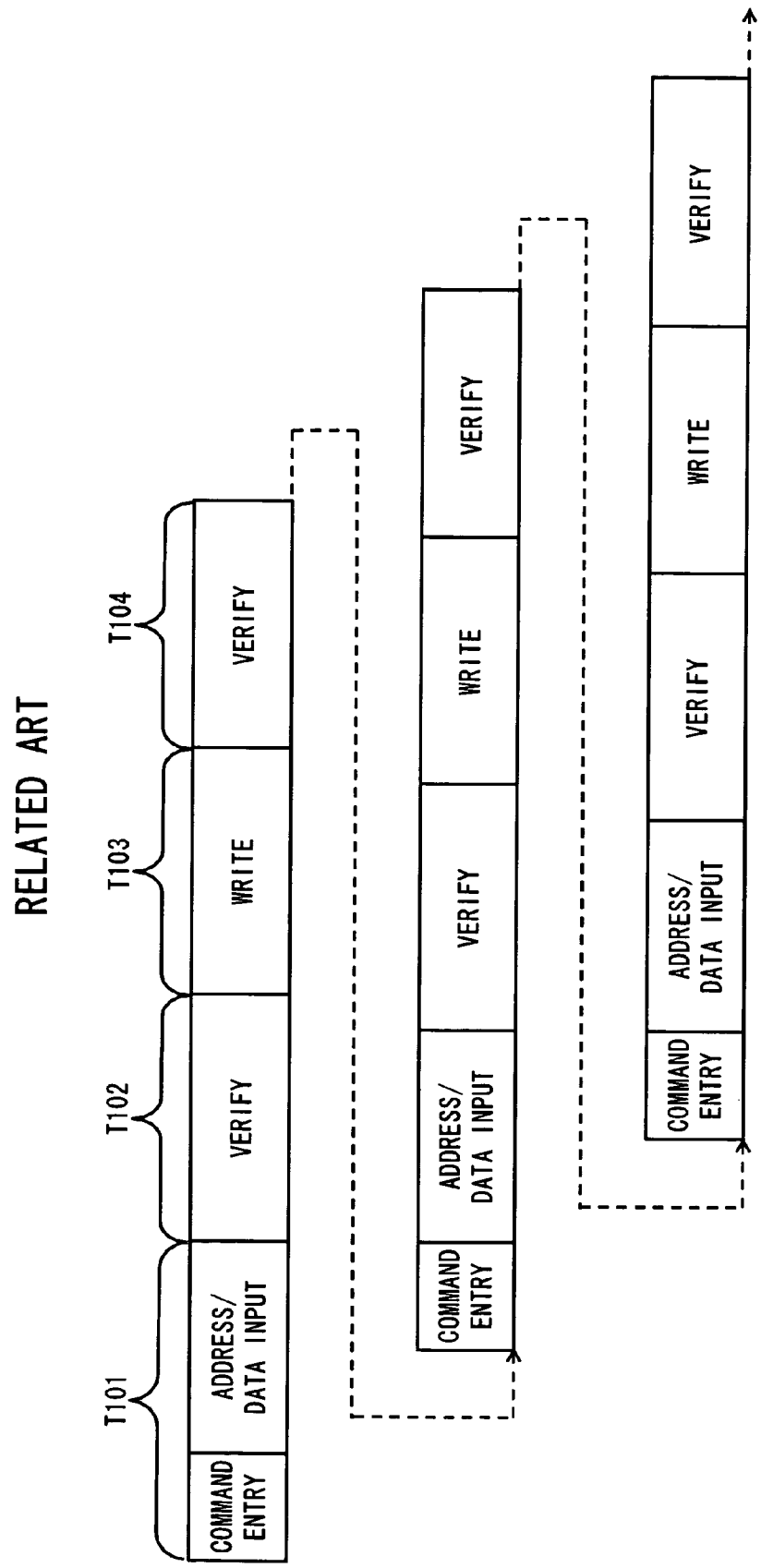
FIG. 21 is a view to describe the flow of write operation of a nonvolatile semiconductor memory of a related art.

In this way, this embodiment allows batch input of a plurality of data segments and addresses, thereby eliminating the need for inputting a command (address and data) for each data, which has been required in the related art shown in FIG. 21. It is thereby possible to reduce the processing time for write operation.

Figure 3:
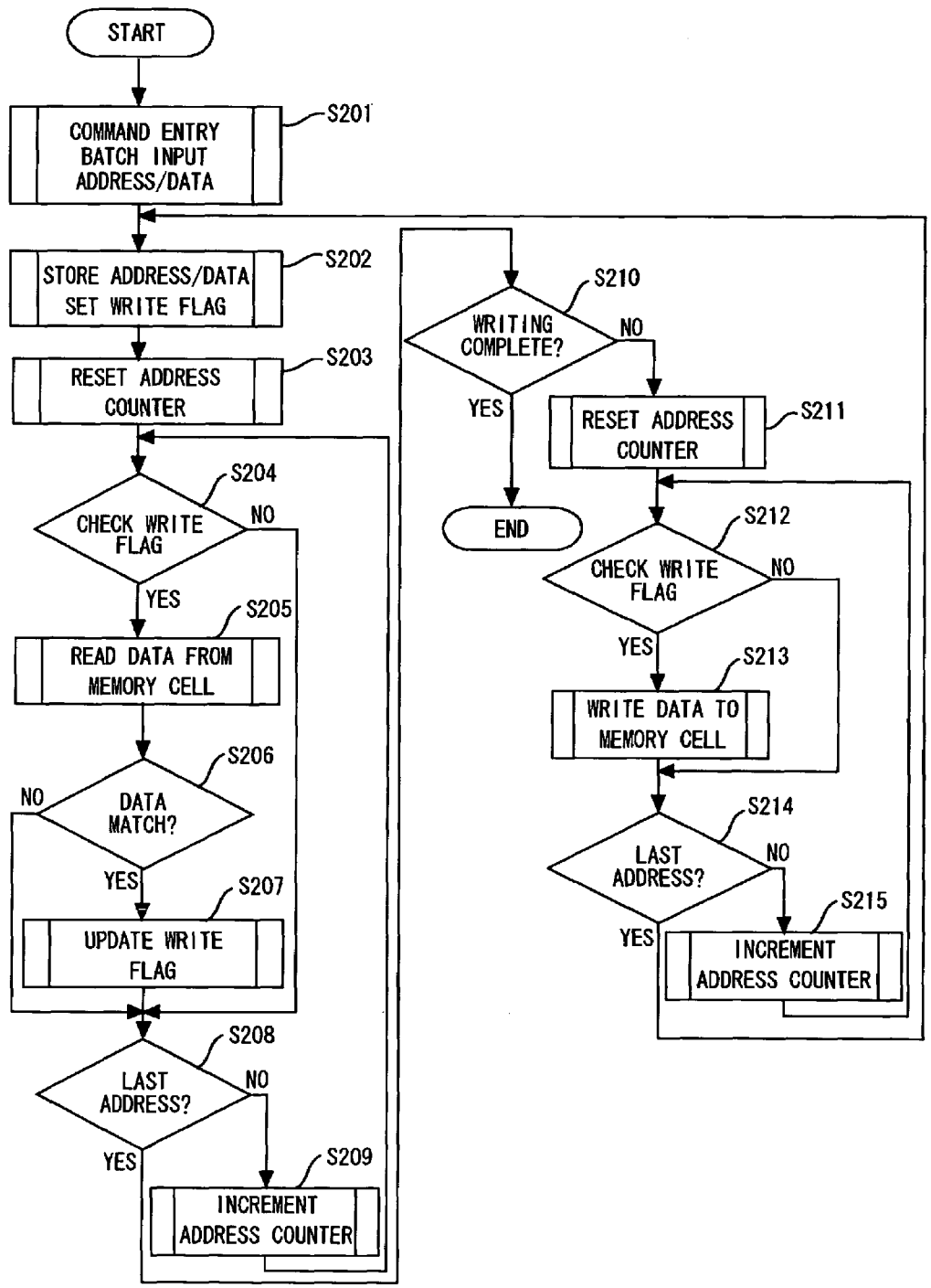
FIG. 3 is a flowchart showing write operation of a nonvolatile semiconductor memory according to an embodiment of the present invention.

Referring then to the flowchart of FIG. 3, the automatic write operation of the nonvolatile semiconductor memory according to this embodiment is described in further detail herein. The automatic write operation is implemented by the control of the sequence controller 4.

Initially, the external addresses and external data segments to be written are input to the buffer 1 at a time as a command from the outside after decoding the command of the automatic write operation (S201). As described above, a plurality of successive data segments and their top addresses are input thereby.

Then, the input external data is stored in a corresponding address of the buffer 1, and the write flag associated with the address (internal address) where the data is to be written is stored in the flag information storage 3 (S202). Since writing has not been performed immediately after the input of the external address and external data, which is at the time of first verify, the write flags in the flag information storage 3 are all set.

After that, the sequence controller 4 resets the counter value of the internal address counter 2 (S203). By setting the counter value to "0", the internal address counter 2 selects the top address of the memory cell.

Then, the sequence controller 4 determines whether the write flag is set for the internal address selected by the internal address counter 2 (S204). Specifically, it refers to the write flag of the selected internal address which is stored in the flag information storage 3 and determines whether the writing has succeeded on this internal address.

If it is determined in the step S204 that the write flag is set, which means that the selected address is a target for writing, the sequence controller 4 controls the read circuit 5 so as to read the data from the memory cell in the memory cell array 7 which has the internal address selected by the internal address counter 2 (S205).

Then, the comparator 9 determines whether the data read by the read circuit 5 matches with the data in the buffer 1 (S206). If the comparator 9 determines in the step S206 that the data matches, it means the verify has succeeded (writing has succeeded) and therefore the sequence controller 4 updates to clear the write flag of the corresponding internal address in the flag information storage 3 (S207). If, on the other and, the comparator 9 determines in the step S206 that the data does not match, it means the verify has failed (writing has failed) and therefore the sequence controller 4 does not update the write flag of the corresponding internal address in the flag information storage 3 so that it remains set.

The process of S205 and S206 is the verify operation for checking if the writing has succeeded. If it is determined in the step S204 that the write flag is not set, the writing has already succeeded and thus the process does not performs the verify nor the update of the flag (S205 to S207).

Then, the sequence controller 4 determines whether the internal address selected by the internal address counter 2 is a last address or not (S208). Specifically, it determines whether the internal address selected according to the counter value reaches the final address of the flag information storage 3. For example, the sequence controller 4 may determine that it is the last address when the internal address counter 2 overflows. In this embodiment, the last address is not the final address of the data to be written but the final address of the flag information storage 3, which is always a fixed address.

If the sequence controller 4 determines in the step S208 that the internal address selected by the internal address counter 2 is not the last address, the sequence controller 4 increments the counter value of the internal address counter 2 (S209). After that, the sequence controller 4 checks the write flag, performs the verify and updates the write flag for the internal address selected by the incremented counter value of the internal address counter 2 (S204 to S207). This is repeated until the last address is reached.

If, on the other hand, the sequence controller 4 determines in the step S208 that the internal address is the last address, it determines whether the writing has completed for all the data segments (S210). If the all the write flags in the flag information storage 3 are cleared (reset), it means that a sequence of buffer writing has completed. If at least one write flag in the flag information storage 3 is set, it means that the writing has not completed. If the sequence controller 4 determines in the step S210 that the writing has all completed, it terminates the automatic write operation.

If, on the other hand, the sequence controller 4 determines in the step S210 that the writing has not all completed, the sequence controller 4 resets the counter value of the internal address counter 2 just like in the step S203 (S211). Then, like S204, the sequence controller 4 determines whether the write flag is set for the internal address selected by the internal address counter 2 (S212).

If the sequence controller 4 determines in the step S212 that the flag is set, it means that the selected address is a target for writing. In this case, the sequence controller 4 controls the write circuit 6 so as to electrically write the corresponding external data in the buffer 1 into the memory cell in the memory cell array 7 which has the internal address selected by the internal address counter 2 (S213). If, on the other hand, the sequence controller 4 determines in the step S212 that the flag is not set, it means that the writing has succeeded. In this case, the sequence controller 4 does not perform writing to the memory cell.

After that, the sequence controller 4 determines whether the internal address selected by the internal address counter 2 is the last address or not just like in S208 (S214).

If the sequence controller 4 determines in the step S214 that the internal address selected by the internal address counter 2 is not the last address, it increments the counter value of the internal address counter 2 just like in S209 (S215).

After that, the sequence controller 4 repeats the checking of the write flag and the writing to the memory cell for the internal address selected according to the incremented counter value of the internal address counter 2 (S212 to S213). This is repeated until the last address is reached.

If, on the other hand, the sequence controller 4 determines in the step S214 that the internal address selected by the internal address counter 2 is the last address, it again resets the counter value of the internal address counter 2 (S203). Then, the process after the step S203 is repeated until the writing of all the data completes.

FIGS. 4A to 4C show the internal addresses and write flags stored in the flag information storage 3.

In the example of FIGS. 4A to 4C, the internal address is 2 bits, the write flag is 1 bit, and four data segments with the internal address $(00)b$ to $(11)b$ are written. In this example, a sequence of automatic write process completes in three times of verify operation. FIG. 4A shows the internal addresses and write flags upon completion of the first verify. FIG. 4B shows the internal addresses and write flags upon completion of the second verify. FIG. 4C shows the internal addresses and write flags upon completion of the third verify.

When an external address and external data is input, the write flag is set for all of the internal address $(00)b$ to $(11)b$. In the first verify, the data writing to the memory cell is not performed, and therefore all the write flags are set upon completion of the first verify as shown in FIG. 4A. In this condition, the first writing is performed to the memory cells with the internal addresses $(00)b$ to $(11)b$. In this example, the first writing succeeds in the internal addresses $(01)b$ and $(10)b$ while it fails in the internal addresses $(00)b$ and $(11)b$.

Then, in the second verify, the write flag for the internal addresses $(01)b$ and $(10)b$ are reset to "0". Thus, upon completion of the second verify, the flags are set only for the internal addresses $(00)b$ and $(11)b$ as shown in FIG. 4B. In this condition, the second writing is performed to the memory cells with the internal addresses $(00)b$ and $(11)b$. In this example, the second writing succeeds in the internal addresses $(00)b$ and $(11)b$.

Then, in the third verify, the write flag for the internal addresses $(00)b$ and $(11)b$ are reset to "0". Thus, upon completion of the third verify, all the flags are cleared as shown in FIG. 4C. The write operation on the internal addresses $(00)b$ to $(11)b$ thereby completes.

FIGS. 5A and 5B show the flow of the verify operation in the example of FIGS. 4A to 4C. FIG. 5A shows the first or the second verify operation in which the internal addresses and the write flags are in the states as shown in FIG. 4A.

Initially, the sequence controller 4 resets the counter value of the internal address counter 2 and checks the write flag of the internal address (00)*b* which is selected by the counter value "0" (S301). Since the write flag of the internal address (00)*b* is (1)*b*, the verify operation is performed on the memory cell with the internal address (00)*b* (S302).

Then, the sequence controller 4 increments the counter value of the internal address counter 2 and checks the write flag of the internal address (01)*b* which is selected by the counter value "1" (S303). Since the write flag of the internal address (01)*b* is (1)*b*, the verify operation is performed on the memory cell with the internal address (01)*b* (S304).

Further, in the same manner, the sequence controller 4 increments the counter value of the internal address counter 2, checks the write flag of the internal address (10)*b*, performs the verify operation, checks the write flag of the internal address (11)*b*, and performs the verify operation (S305 to S308). Then, the address selected by the internal address counter 2 reaches the last address, which is the internal address (11)*b* in this case, and thereby the first or the second verify operation completes. The first write operation is performed in the same way as described above by sequentially selecting the internal addresses (00)*b* to (11)*b* and writing the data to each address.

FIG. 5B shows the third verify operation in which the internal addresses and the write flags are in the states as shown in FIG. 4B.

Initially, the sequence controller 4 resets the counter value of the internal address counter 2 and checks the write flag of the internal address (00)*b* which is selected by the counter value "0" (S309). Since the write flag of the internal address (00)*b* is (1)*b*, the verify operation is performed on the memory cell with the internal address (00)*b* (S310).

Then, the sequence controller 4 increments the counter value of the internal address counter 2 and checks the write flag of the internal address (01)*b* which is selected by the counter value "1" (S311). Since the write flag of the internal address (01)*b* is (0)*b*, the verify operation is not performed.

Further, the sequence controller 4 increments the counter value of the internal address counter 2 and checks the write flag of the internal address (10)*b* which is selected by the counter value "2" (S312). Since the write flag of the internal address (10)*b* is (0)*b*, the verify operation is not performed.

Furthermore, the sequence controller 4 increments the counter value of the internal address counter 2 and checks the write flag of the internal address (11)*b* which is selected by the counter value "3" (S313). Since the write flag of the internal address (11)*b* is (1)*b*, the verify operation is performed on the memory cell with the internal address (11)*b* (S314). Then, the address selected by the internal address counter 2 reaches the last address, which is the internal address (11)*b* in this case, and thereby the third verify operation completes. The second write operation is performed in the same way as described above by sequentially selecting the internal addresses (00)*b* to (11)*b* and writing the data to the internal addresses (00)*b*. and (11)*b*.

As described in the foregoing, this embodiment inputs a plurality of data segments and the addresses of the data segments at a time as a command supplied from the outside. This eliminates the need for inputting a command for each data segment, thus enabling the efficient write operation and thereby reducing a time for the write operation.

Further, by setting a flag for each of the plurality of addresses and performing the verify or writing according to the flag, it is possible to perform the verify or write operation on the data as a unit of writing, thus enabling more efficient operation.

Second Embodiment

A nonvolatile semiconductor memory according to the second embodiment of the present invention is described hereinafter. The nonvolatile semiconductor memory of this embodiment allows batch input of data segments with successive addresses. Further, it sets a flag indicating completion of writing for each address and selects a plurality of flags and process them in parallel at substantially the same time.

In the first embodiment described above, redundant address selection operation can occur when implementing the buffer operation, which can cause a decrease in processing speed. As described with reference to FIGS. 5A and 5B, the first embodiment increments the counter value and searches for an address where a write flag is set always sequentially. Thus, it selects every address once, even a non-target address where a write flag is not set. A write operation speed can decrease due to the unnecessary address selection which is always performed in the first embodiment.

The operation of searching for the write flag is performed each time the write operation or the read operation is performed. Thus, as the operation is repeated, a redundant address selection time increases accordingly. The number of redundant addresses in the write flag search operation increases as the number of write target addresses decreases. Thus, a redundant processing time increases as the number of addresses specified by the external command decreases with respect to the buffer size.

To overcome this drawback, the second embodiment selects only a necessary address without selecting addresses always sequentially in the search operation for a write flag.

Figure 6:
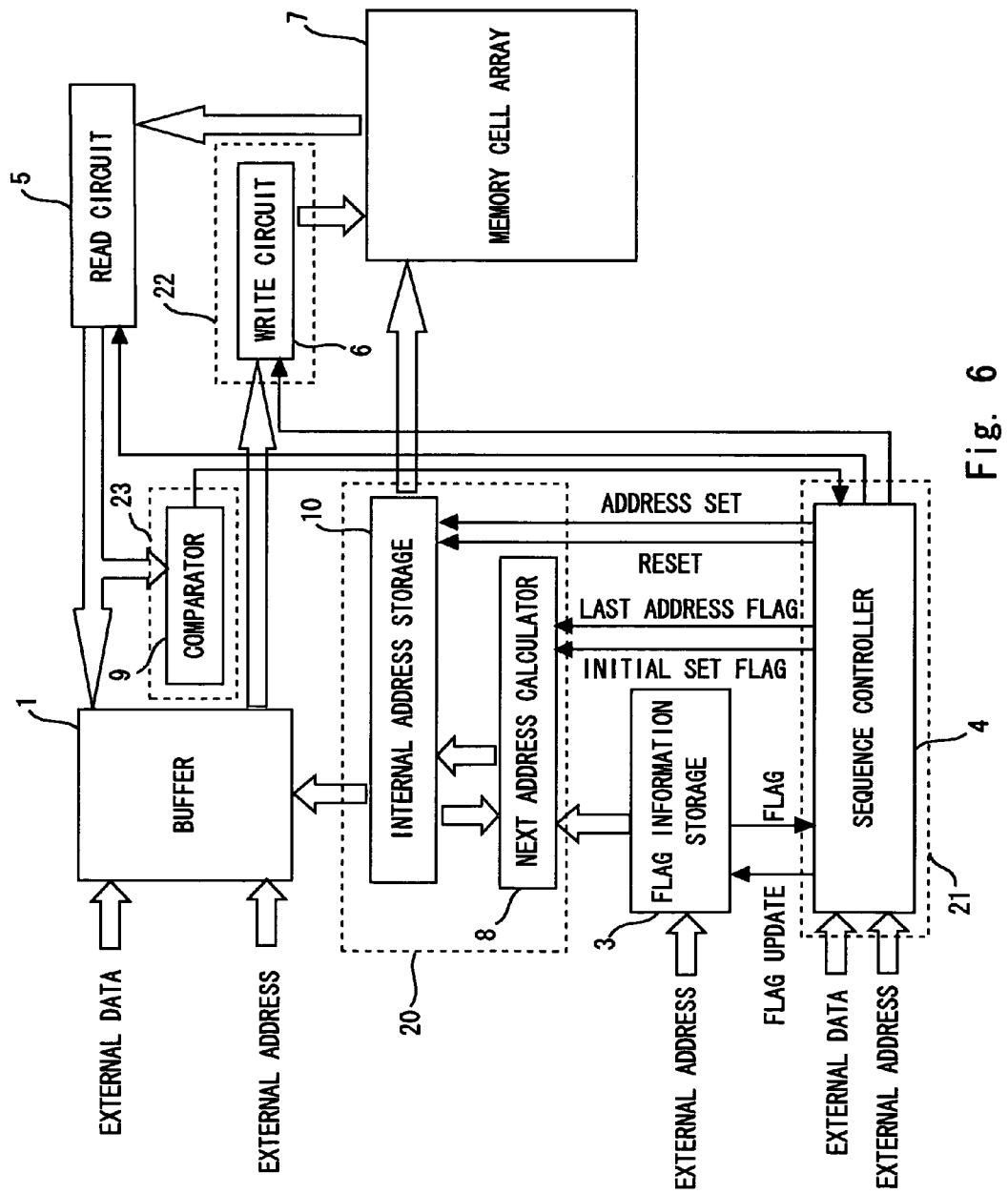
FIG. 6 is a block diagram showing the structure of a nonvolatile semiconductor memory according to an embodiment of the present invention.

Referring then to FIG. 6, the structure of the nonvolatile semiconductor memory according to this embodiment is described hereinafter. In FIG. 6, the same elements as in FIG. 1 are denoted by the same reference numerals and not described in detail herein. As shown in FIG. 6, the nonvolatile semiconductor memory of this embodiment includes an internal address storage 10 instead of the internal address counter 2 and further includes a next address calculator 8. The internal address storage 10 and the next address calculator 8 serve as the address setting circuit 20.

The internal address storage 10 stores internal addresses set by the sequence controller 4. It selects an address where data is to be written or read from the memory cell array 7 according to the set internal address. Thus, though the internal address storage 10 has substantially the same structure as the internal address counter 2 in the first embodiment, only the setting of the internal address is performed therein and the incrementation is not performed by the sequence controller 4.

The next address calculator 8 calculates the address to be selected next, which is referred to hereinafter as the next address, from the internal addresses presently set to the internal address storage 10. Since the calculated next address is a write target address, the unnecessary address selection operation as in the first embodiment does not occur. In the search (select) operation for the first write flag, the sequence controller 4 inputs an initial set flag. The next address calculator 8 calculates the next address and further determines whether the address is a last address. If the calculated next address a last address, the next address calculator 8 outputs a last address flag to the sequence controller 4.

Figure 7:
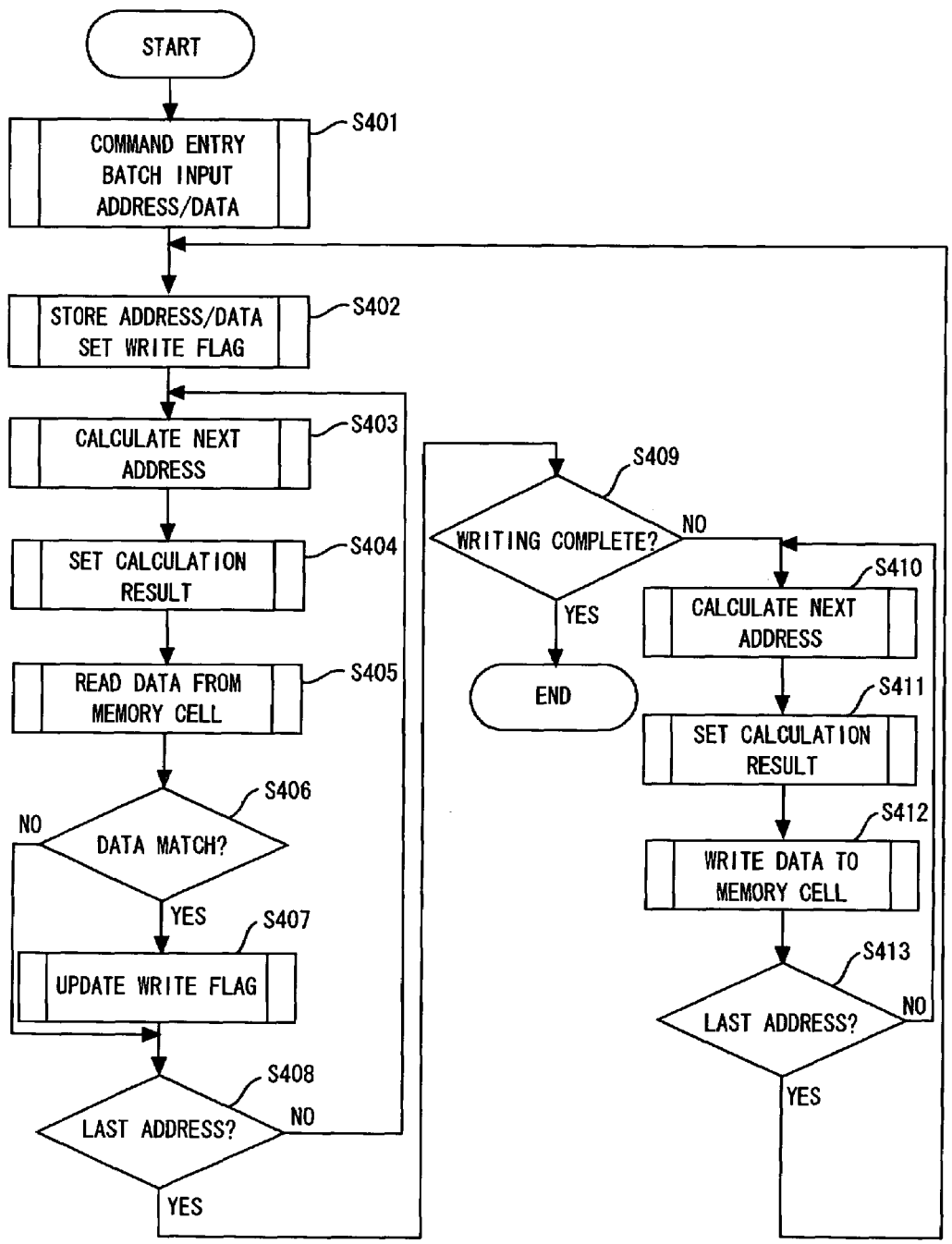
FIG. 7 is a flowchart showing write operation of a nonvolatile semiconductor memory according to an embodiment of the present invention.

The automatic write operation in the nonvolatile semiconductor memory according to this embodiment is described herein. Since the automatic write operation is basically the same as that shown in FIG. 2, the detail of the automatic write operation of this embodiment is described herein with reference to the flowchart of FIG. 7.

Initially, the external addresses and external data segments to be written are input to the buffer 1 at a time as a command from the outside after decoding the command of the automatic write operation (S401). As is the case with the first embodiment, a plurality of successive data segments and their top addresses are input thereby.

Then, the input external data is stored in a corresponding address of the buffer 1, and the write flag associated with the address (internal address) where the data is to be written is stored in the flag information storage 3 (S402).

After that, the next address calculator 8 calculates a next address which is an internal address to be selected next and further calculates whether the calculated internal address is a last address or not (S403). In this calculation, the next address calculator 8 uses the current internal address (initial reset state) from the internal address storage 10 and the write flag in the flag information storage 3.

Then, the sequence controller 4 sets the next address calculated by the next address calculator 8 to the internal address storage 10 (S404). The next address calculated by the next address calculator 8 is thereby set as the current internal address so that the internal address storage 10 selects the newly set internal address.

The sequence controller 4 then controls the read circuit 5 so as to read the data from the memory cell in the memory cell array 7 which has the internal address selected by the internal address storage 10 (S405).

After that, the comparator 9 determines whether the data read by the read circuit 5 matches with the data in the buffer 1 (S406). If the comparator 9 determines in the step S206 that the data matches, it means the verify has succeeded (writing has succeeded) and therefore the sequence controller 4 updates to clear the write flag of the corresponding address in the flag information storage 3 (S407). If, on the other and, the comparator 9 determines in the step S206 that the data does not match, it means the verify has failed (writing has failed) and therefore the sequence controller 4 does not update the write flag of the corresponding address in the flag information storage 3 so that it remains set.

Then, the sequence controller 4 determines whether the internal address selected by the internal address storage 10 is a last address or not (S408). Since the next address calculator 8 has already determined whether the current internal address is a last address or not and set a last address flag, the sequence controller 4 determines if it is a last address according to the last address flag.

If the sequence controller 4 determines in the step S408 that the address selected by the internal address storage 10 is not the last address, the next address calculator 8 again calculates the address to be selected next based on the current internal address, which is the address set last time, from the internal address storage 10 and the write flag in the flag information storage 3 and further calculates whether it is a last address or not (S403). Then, the calculated address is set to the internal address storage 10 (S404). After that, the sequence controller 4 performs the verify and the update of the write flag in the same manner (S405 to S407) and repeats this process until the last address is reached.

If, on the other hand, the sequence controller 4 determines in the step S408 that the internal address is the last address, it further determines whether the writing has completed for all the data segments (S409). If the last address flag indicating that it is the last address is set by the next address calculator 8 and the write flags in the flag information storage 3 are all cleared, it means that a sequence of automatic write operation completes. If at least one write flag in the flag information storage 3 is set, it means that the writing has not completed. If the sequence controller 4 determines in the step S409 that the writing has all completed, it terminates the automatic write operation.

If, on the other hand, the sequence controller 4 determines in the step S409 that the writing has not all completed, the next address calculator 8 calculates the address to be selected next based on the current internal address (reset state) in the internal address storage 10 and the write flag in the flag information storage 3 and further calculates whether it is a last address or not just like in S403 (S410).

Then, the sequence controller 4 sets the next address calculated by the next address calculator 8 to the internal address storage 10 just like in S404 (S411).

The sequence controller 4 then controls the write circuit 6 so as to electrically write the corresponding external data in the buffer 1 into the memory cell in the memory cell array 7 which has the address selected by the internal address storage 10 (S412).

Then, the sequence controller 4 determines whether the address selected by the internal address storage 10 is a last address or not just like in S408 (S413). If the sequence controller 4 determines in the step S413 that the address selected by the internal address storage 10 is not the last address and when the last address flag indicating a last address is not set by the next address calculator 8, the next address calculator 8 again calculates the address to be selected next based on the current internal address, which is the address set last time, in the internal address storage 10 and the write flag in the flag information storage 3 and further calculates whether it is a last address or not (S410). Then, the calculated address is set to the internal address storage 10 (S411). After that, the sequence controller 4 performs the write operation in the same manner (S412) and repeats this process until the last address is reached.

If, on the other hand, the sequence controller 4 determines in the step S413 that the address selected by the internal address storage 10 is the last address and when the last address flag indicating a last address is set by the next address calculator 8, the next address calculator 8 again calculates the next address (S403). After that, the process after the step S403 is repeated until the writing of all the data segments completes.

Figures 8A, 8B:
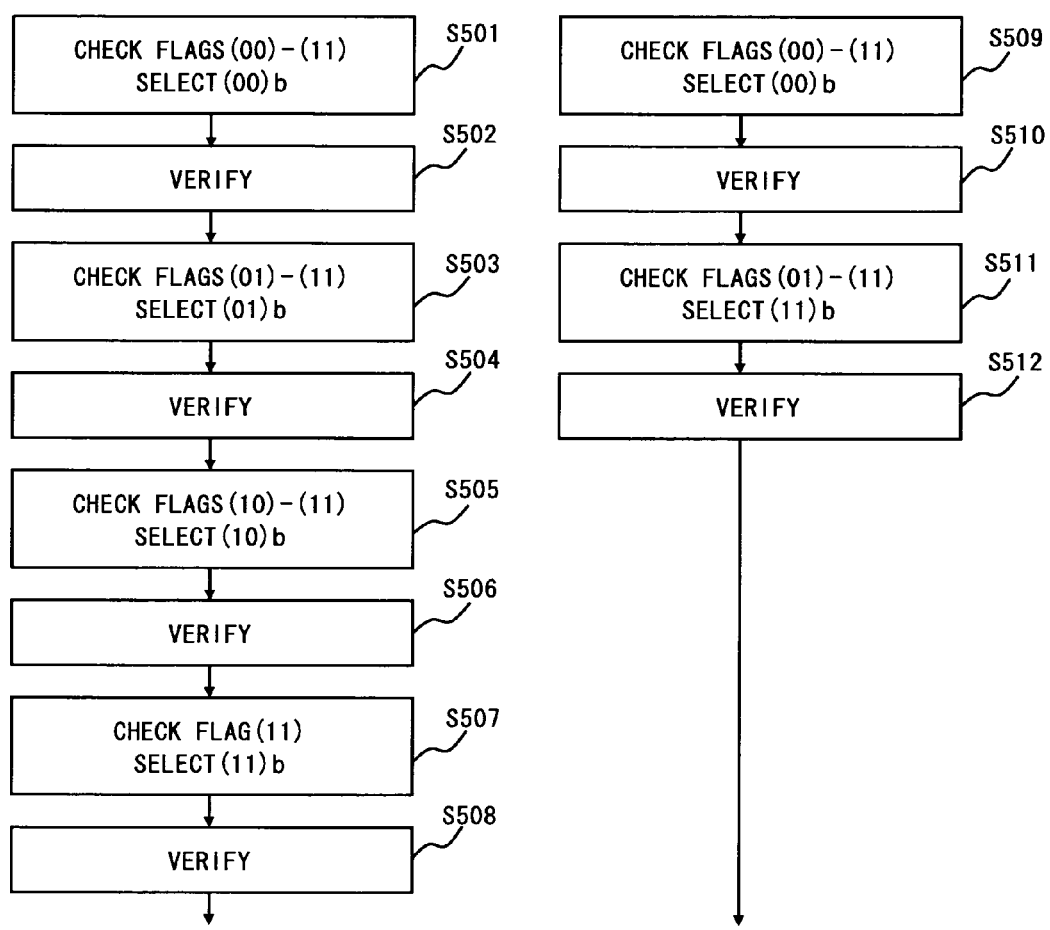
FIGS. 8A and 8B are flowcharts showing write operation of a nonvolatile semiconductor memory according to an embodiment of the present invention.

Referring now to FIGS. 8A and 8B, a specific example of the automatic write operation in the nonvolatile semiconductor memory according to this embodiment is described hereinafter. FIGS. 8A and 8B show each verify operation in the example of FIGS. 4A to 4C just like FIGS. 5A and 5B in the first embodiment.

FIG. 8A shows the first or the second verify operation in which the internal addresses and the write flags are in the states as shown in FIG. 4A.

Since it is initial condition, the next address calculator 8 checks all the write flags for the internal addresses (00)$b$ to (11)$b$ at the same time and calculates a minimum internal address for which the write flag is set (S501). Since the write flag for the internal address (00)$b$ is (1)$b$, the internal address (00)$b$ is calculated and set to the internal address storage 10 so that the internal address (00)$b$ is selected. Then, the verify operation is performed on the memory cell with the internal address (00)$b$ (S502).

Then, since the internal address (00)$b$ is selected in the internal address storage 10, the next address calculator 8 checks all the write flags for the internal address larger than (00)$b$, which is the internal addresses (01)$b$ to (11)$b$, at the same time and calculates a minimum internal address for which the write flag is set (S503). Since the write flag for the internal address (01)$b$ is (1)$b$, the internal address (01)$b$ is calculated and set to the internal address storage 10 so that the internal address (01)$b$ is selected. Then, the verify operation is performed on the memory cell with the internal address (01)$b$ (S504).

In this way, the process further checks the write flags for the internal address (10)$b$ and the internal address (11)$b$ when the internal address is (01)$b$ (S505) and verifies the memory cell with the internal address (10)$b$ (S506). It further checks the write flag for the internal address (11)$b$ when the internal address is (10)b (S507) and verifies the memory cell with the internal address (11)b (S508). The address selected from the internal address storage 10 thereby reaches the last address, which is the internal address (11)b in this case, and the first or the second verify operation completes therewith. The first write operation is performed in the same way as described above by selecting the internal addresses (00)b to (11)b and writing the data to each address.

FIG. 8B shows the third verify operation in which the internal addresses and the write flags are in the states as shown in FIG. 4B.

Since it is initial condition, the next address calculator 8 checks all the write flags for the internal addresses (00)b to (11)b at the same time and calculates a minimum internal address for which the write flag is set (S509). Since the write flag for the internal address (00)b is (1)b, the internal address (00)b is calculated and set to the internal address storage 10 so that the internal address (00)b is selected. Then, the verify operation is performed on the memory cell with the internal address (00)b (S510).

Then, since the internal address (00)b is selected in the internal address storage 10, the next address calculator 8 checks all the write flags for the address larger than (00)b, which is the internal addresses (01)b to (11)b, at the same time and calculates a minimum internal address for which the write flag is set (S511). Since the write flags for the internal addresses (01)b and (10)b are (0)b and the write flag for the internal address (11)b is (1)b, the internal address (11)b is calculated and set to the internal address storage 10 so that the internal address (11)b is selected. Then, the verify operation is performed on the memory cell with the internal address (11)b (S512). Then, the address selected by the internal address storage 10 reaches the last address, which is the internal address (11)b in this case, and thereby the third verify operation completes. The second write operation is performed in the same way as described above by selecting the internal addresses (00)b to (11)b and writing the data to each address.

As described in the foregoing, this embodiment selects only the address for which the write flag is set. This avoids selecting the addresses always sequentially as in the first embodiment shown in FIG. 5, thereby reducing a processing time for the write flag search operation.

Figure 9:
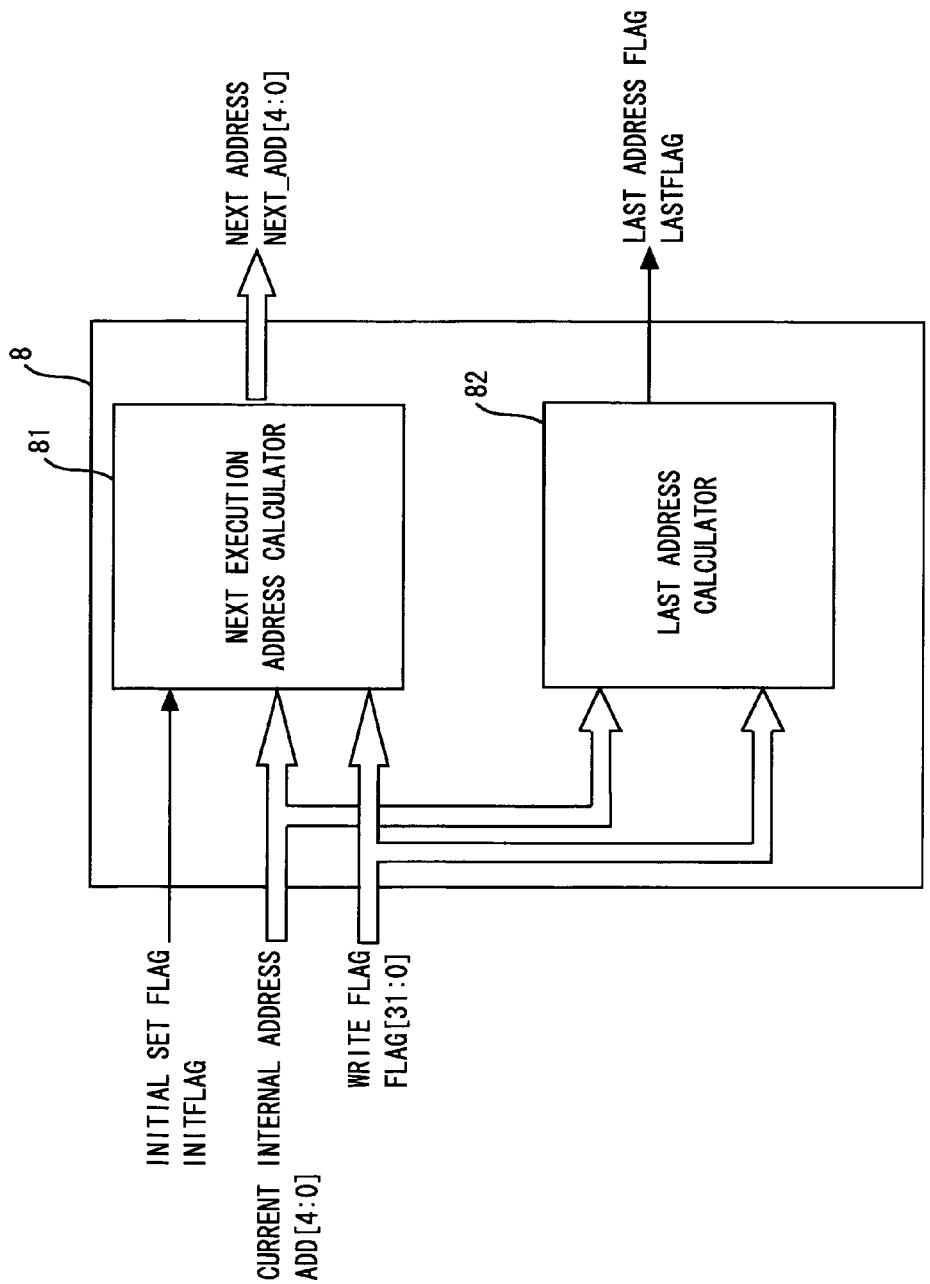
FIG. 9 is a block diagram showing the structure of a next address calculator of a nonvolatile semiconductor memory according to an embodiment of the present invention.

The structure and the operation of the next address calculator 8 are described hereinafter. FIG. 9 shows the structure of the next address calculator 8. As shown in FIG. 9, the next address calculator 8 includes a next execution address calculator 81 and a last address calculator 82.

The next execution address calculator 81 inputs the current internal address and write flag and an initial set flag, calculates the next address to be selected for which the write flag is set and outputs the calculated address to the sequence controller 4. The next execution address calculator 81 serves as a next execution address selector which checks a plurality of flags stored in the flag information storage 3 at substantially the same time and selects the address of the set flag from the plurality of flags for each operation of data writing, erasing or verifying. The last address calculator 82 inputs the current internal address and write flag, calculates a last address flag which indicates whether the internal address is a last address and outputs the result to the sequence controller 4. The last address calculator 82 serves as a last address determinator which checks a plurality of flags stored in the flag information storage 3 at substantially the same time upon selection of the address and, when all of the plurality of flags are not set, determines the completion of the data write, erase or verify operation.

In this example, the capacity of the buffer 1, which is the maximum size of written data, is 32 addresses. Thus, the number of write flags which indicate that an address is a target for writing is 32, the internal address which is required for selecting the memory cell on which the data is to be written is 5 bits ($2^5$=32).

The current internal address, which is the internal address set to the internal address storage 10, is referred to herein as ADD[4:0], which represents 5 bits from 0th bit to 4th bit. The initial set flag which is generated by the sequence controller 4 and indicates the first address selection operation is referred to as INITFLAG. The write flag which is stored in the flag information storage 3 and indicates a write target is referred to as FLAG[31:0]. The next address which is the calculation result of the next execution address calculator 81 is referred to as NEXT_ADD[4:0]. The last address flag which is the calculation result of the last address calculator 82 is referred to as LASTFLAG.

In this embodiment, the last address is not the final address where the counter overflows as in the first embodiment, such as (1_1111)b=(31)d if 5 bits. The last address in this embodiment is the final address of the addresses for which a write flag is set (addresses to which data is to be written) in the buffer 1. Thus, the last address does not mean that it is always (1_1111)b.

Figure 10:
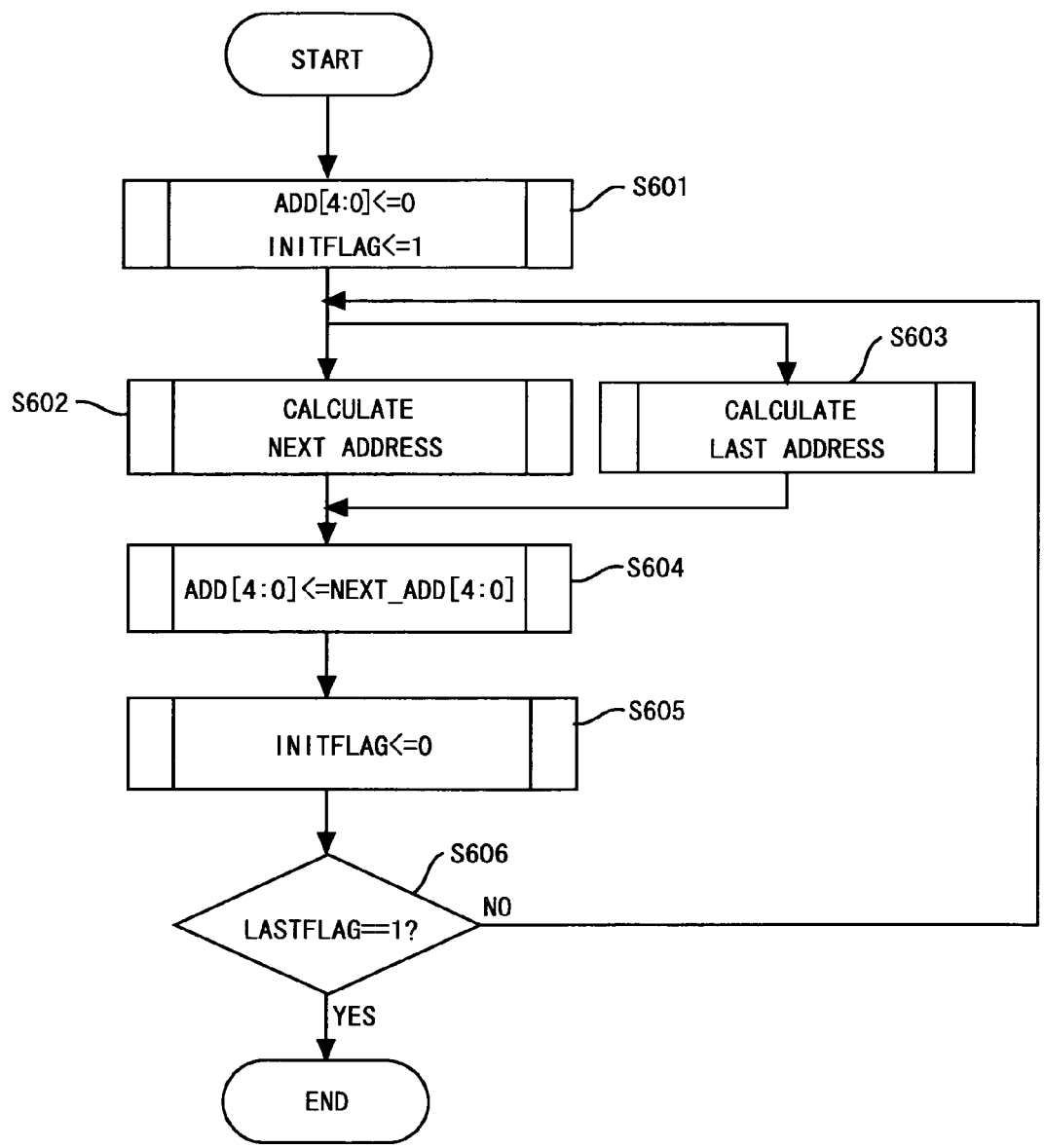
FIG. 10 is a flowchart showing address selection operation of a nonvolatile semiconductor memory according to an embodiment of the present invention.

Referring then to the flowchart of FIG. 10, the address selection operation in the nonvolatile semiconductor memory according to this embodiment is described hereinafter. FIG. 10 is the flowchart which extracts the address selection operation from the flowchart of FIG. 7.

As initial setting, the sequence controller 4 resets the internal addresses in the internal address storage 10 (ADD[4:0]=(0_0000)b=(0)d) and sets an initial set flag (INITFLAG=1) (S601).

Then, the next execution address calculator 81 calculates the next address NEXT_ADD[4:0] (S602). At the same time, the last address calculator 82 calculates the last address flag LASTFLAG (S603). The calculation method in the next execution address calculator 81 and the last address calculator 82 is detailed later.

After that, the sequence controller 4 sets the next address NEXT_ADD[4:0] which is the calculation result of the next execution address calculator 81 to the internal address storage 10 (ADD[4:0]=NEXT_ADD[4:0]) (S604). The memory cell corresponding to the address of the calculation result is thereby selected.

Then, the sequence controller 4 resets the initial set flag (INITFLAG=0) for the subsequent address calculation (S605).

The sequence controller 4 then determines whether the current internal address is a last address (LASTFLAG=1) by the last address flag which is the calculation result of the last address calculator 82 (S606). If the last address flag is not set (LASTFLAG=0), it means that the memory cell to be processed next exists. Thus, the next execution address calculator 81 again calculates the address to be selected (S602). If, on the other hand, the last address flag is set (LASTFLAG=1), it means that the current internal address is the final address to be processed in the buffer, and thereby the address selection operation completes.

The flowchart of FIG. 10 shows one-time address selection operation in the buffer. The address selection operation in the buffer (operation of FIG. 10) is performed a plurality of times in the flowchart of the automatic write operation shown in FIG. 7 (S403 to S408, S410 to S413).

Referring now to the flowchart of FIG. 11, the method for calculating the next address NEXT_ADD[4:0] in the next execution address calculator 81 is described hereinafter. The next execution address calculator 81 compares the current internal address ADD[4:0] with the state of the write flag FLAG[31:0] and calculates the next address NEXT_ADD[4:0] to be executed next.

Figure 11:
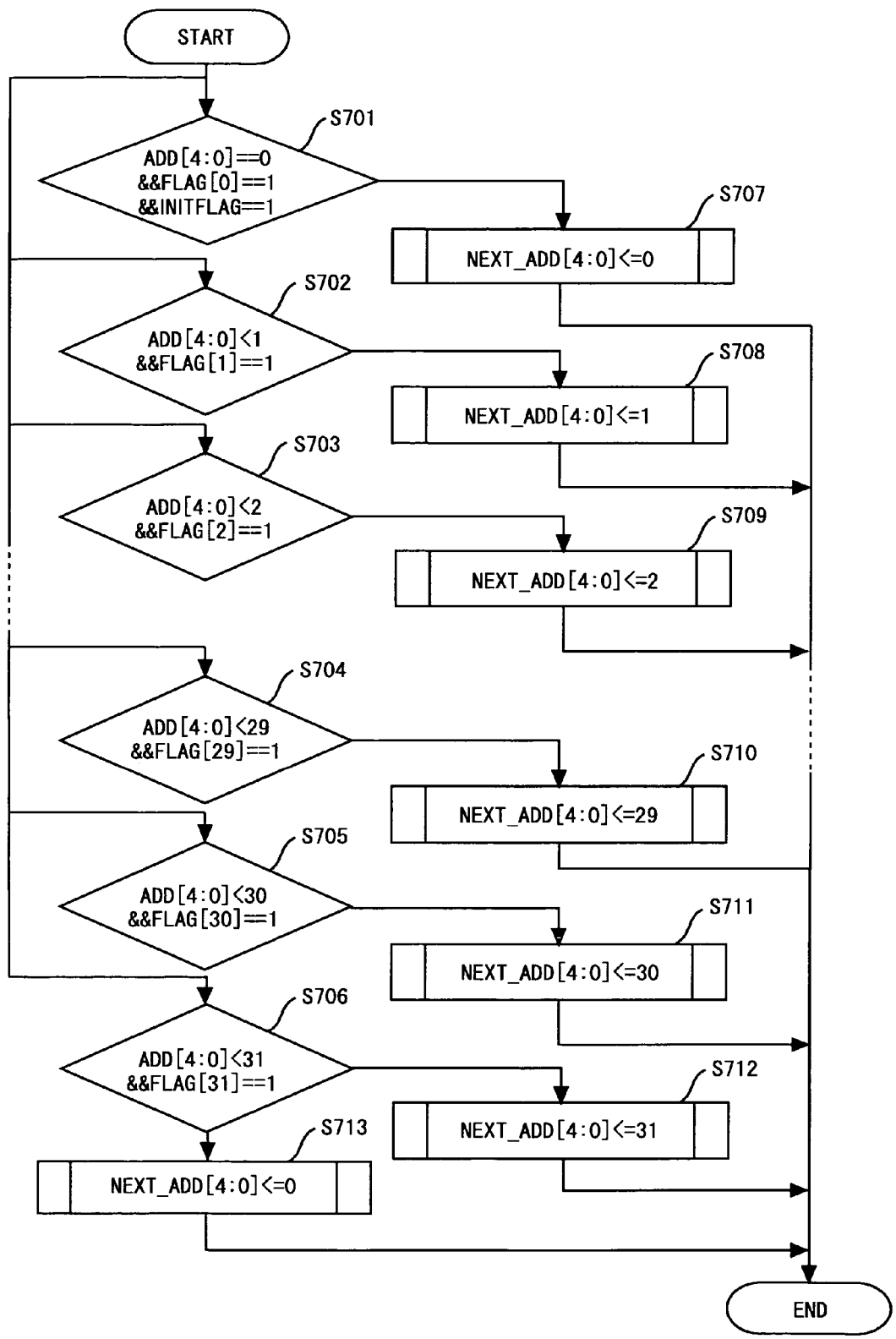
FIG. 11 is a flowchart showing a next address calculation operation of a nonvolatile semiconductor memory according to an embodiment of the present invention.

The symbol "==" in FIG. 11 represents match determination, "<" represents magnitude relation determination, "&&" represents logical product, and "<=" represents substitution. The following description uses the symbol "=" as an equal sign.

The next execution address calculator 81 first determines whether the current internal address is a top address (ADD [4:0]=(0)d), the write flag for the top address is set (FLAG[0] =1) and further the initial set flag is set (INITFLAG=1) (S701). Thus, it determines whether the top address is a write target in the first address calculation. If the conditions of S701 are satisfied, the next execution address calculator 81 sets the next address to the top address (NEXT_ADD[4:0]<=(0)d) (S707).

The reason that the condition of the initial set flag INITFLAG is required in S701 is because it is necessary to distinguish between the case where the selected address is the top address in the first time, which is where the current internal address is ADD[4:0]=(0)d in the second address calculation also and the case where the current internal address is ADD [4:0]=(0)d in the first address calculation.

Further, the determination of the steps S702 to S706 is performed at substantially the same time as the step S701. The steps S702 to S706 determine whether the write flag is set for the address next to the current internal address including the address for which the flag is not set.

In S702, the next execution address calculator 81 determines whether the current internal address is ADD[4:0]<(1)d, which is the top address (ADD[4:0]=(0)d), and the write flag for the 1st address is set (FLAG[1]=1). Since the determination of S701 is performed in preference to the determination of S702, the conditions in S702 include that the conditions for S701 are not satisfied. If the conditions for S702 are satisfied, the next address is set to the 1st address (NEXT_ADD[4:0] <=(1)d) (S708).

In S703, the next execution address calculator 81 determines whether the current internal address is ADD[4:0]<(2)d, which is the top address (ADD[4:0]=(0)d) or 1st address (ADD[4:0]<=(1)d), and the write flag for the 2nd address is set (FLAG[2]=1). Since the determination of S701 and S702 is performed in preference to the determination of S703, the conditions in S703 include that the conditions for S701 and S702 are not satisfied. If the conditions for S703 are satisfied, the next address is set to the 2nd address (NEXT_ADD[4:0] <=(2)d) (S709).

Similarly, the next execution address calculator 81 performs the determination on the cases where the current internal address is ADD[4:0]<(3)d to (30)d (S704, S705) and sets the next address (NEXT_ADD[4:0]<=(3)d to (30)d).

In S706, the next execution address calculator 81 determines whether the current internal address is ADD[4:0]<(31) d, which is the top address to the 30th address (ADD[4:0]= (0)d to (30)d), and the write flag for the 31st address is set (FLAG[31]=1). If the conditions of S706 are satisfied, the next address is set to the 31st address (NEXT_ADD[4:0]<= (31)d) (S712). If, on the other hand, the conditions of S706 are not satisfied, the next address is set to the top address (NEXT_ADD[4:0]<=(0)d) (S713). Thus, the next address is reset in this case. However, since the last address calculator 82 determines the address to be the last address and terminates the process before this condition is satisfied, it is generally not selected.

In this way, this embodiment selects only the necessary address for which the write flag is set, thereby preventing the selection of unnecessary addresses. In some cases, the selection may be made by jumping the addresses.

Figure 12:
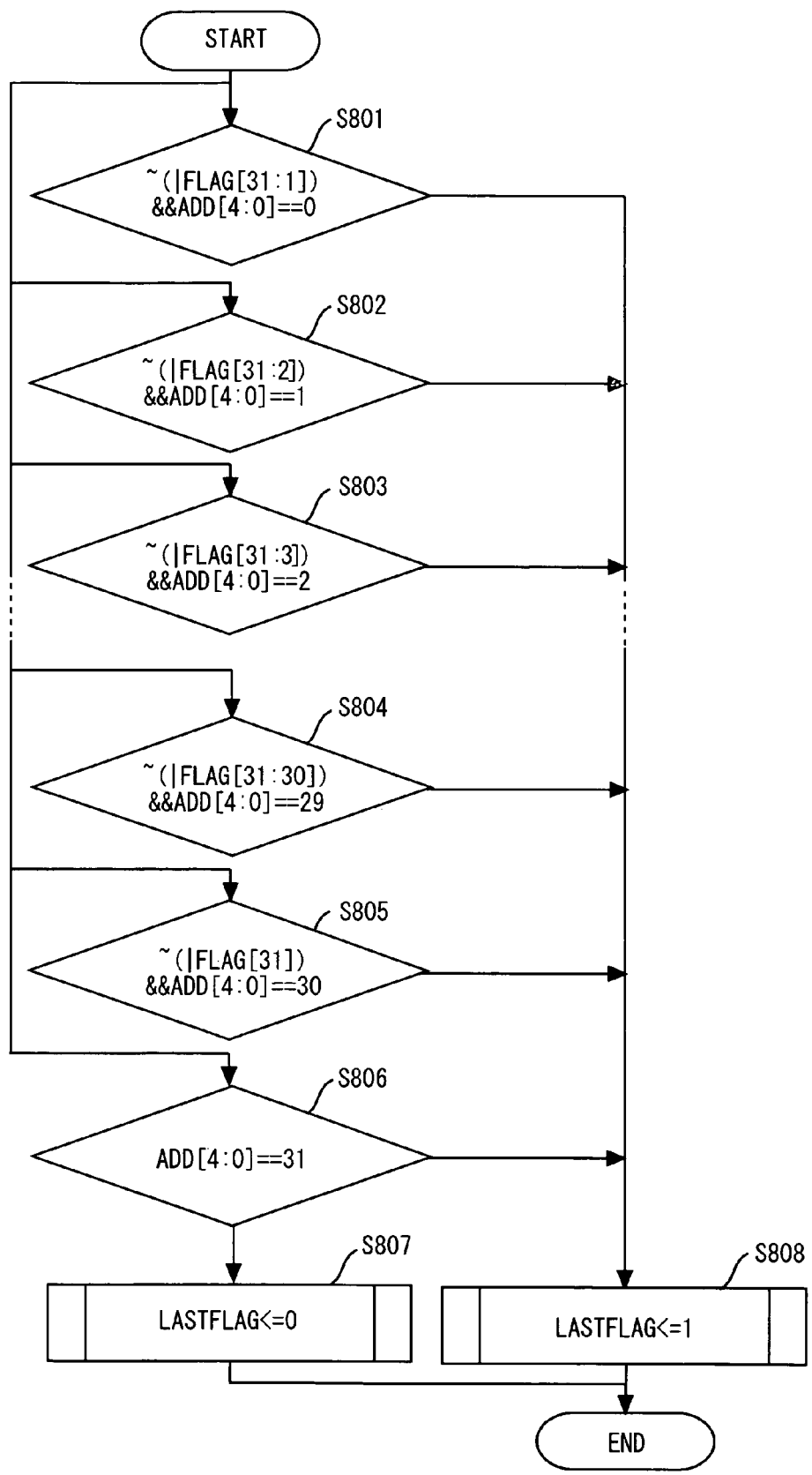
FIG. 12 is a flowchart showing a last address calculation operation of a nonvolatile semiconductor memory according to an embodiment of the present invention.

Referring then to the flowchart of FIG. 12, the method for calculating the last address flag LASTFLAG in the last address calculator 82 is described hereinafter. The last address calculator 82 compares the current internal address ADD[4:0] with the state of the write flag FLAG[31:0] and calculates whether the selected internal address is the last address or not. In FIG. 12, the symbol "~" represents logic inversion and "|" represents a bit logical sum.

The last address calculator 82 determines whether the current internal address is a top address (ADD[4:0]=(0)d) and the write flags are not set for all the addresses from the 1st to 31st address (~(|FLAG[31:1])) (S801). Thus, it determines whether the flags are not set for all the address after the current internal address. If the conditions of S801 are satisfied, it means that the current internal address is the last address. Therefore, the last address calculator 82 sets the last address flag (LASTFLAG=1) (S808).

Further, at substantially the same time as the determination of S802, the determination of S802 to S806 are performed. The steps S802 to S806 determine whether the flags are not set for all the address after the current internal address just like S801.

In S802, the last address calculator 82 determines whether the current internal address is the 1st address (ADD[4:0]=(1) d) and the write flags are not set for all of the 2nd to 31st address (~(|FLAG[31:2])) (S802). If the conditions of S802 are satisfied, it means that the current internal address is the last address as in S801. Therefore, the last address calculator 82 sets the last address flag (LASTFLAG=1) (S808).

Similarly, the last address calculator 82 performs the comparation on the cases where the current internal address is ADD[4:0]=(2)d to (30)d (S804, S805) and sets the last address flag (LASTFLAG=1) (S808).

Further, in S806, when the current internal address is the 31st address (ADD[4:0]=(31)d), the last address calculator 82 sets the last address flag (LASTFLAG=1) in order to indicate that the internal address is the last address without recourse to the write flag (S808). If the conditions of S806 are not satisfied, it means that the current internal address ADD [4:0] is not the last address. Therefore, the last address calculator 82 resets the last address flag (LASTFLAG=0) (S807).

By calculating the last address flag based on the flags set for the addresses after the current addresses, it is possible to terminate the process upon reaching the last of the necessary address for which the write flag is set without counting up the internal address storage 10 for all bits. This prevents the selection of necessary addresses.

Figure 13:
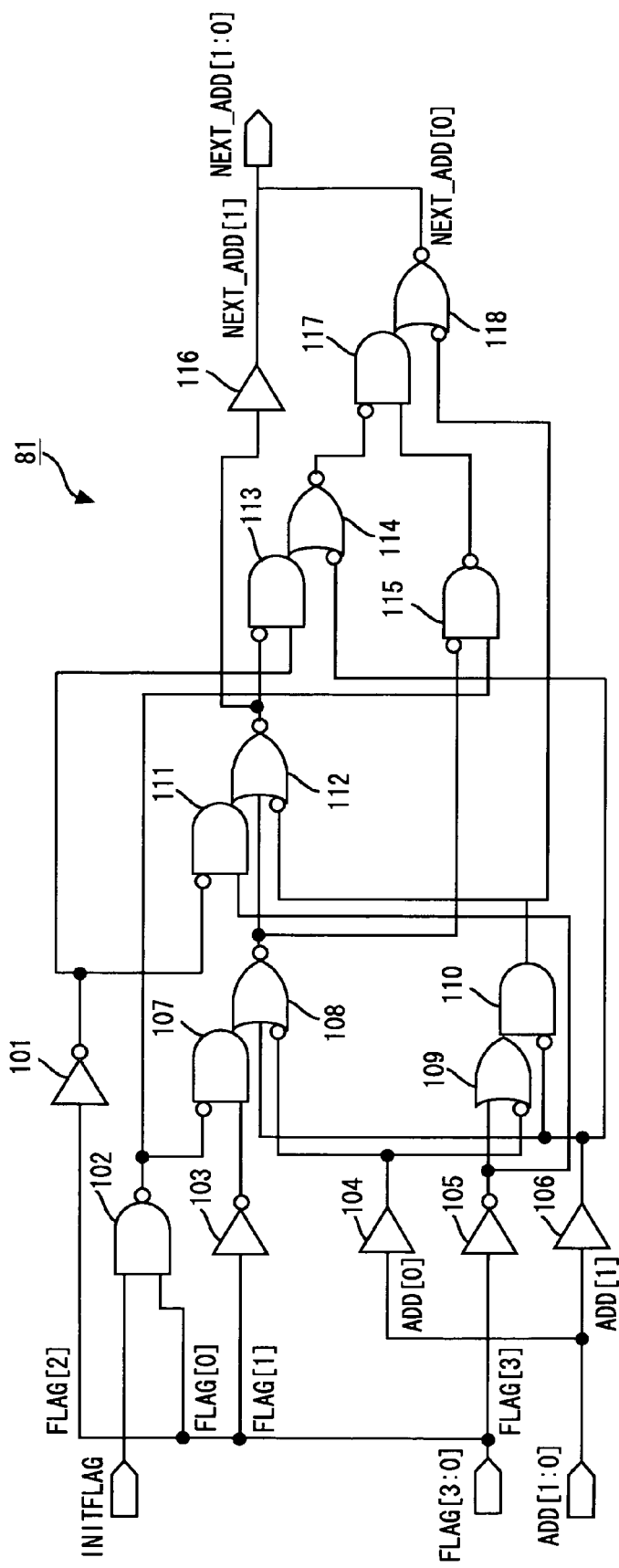
FIG. 13 is a circuit diagram showing the structure of a next execution address calculator of a nonvolatile semiconductor memory according to an embodiment of the present invention.
Figure 14:
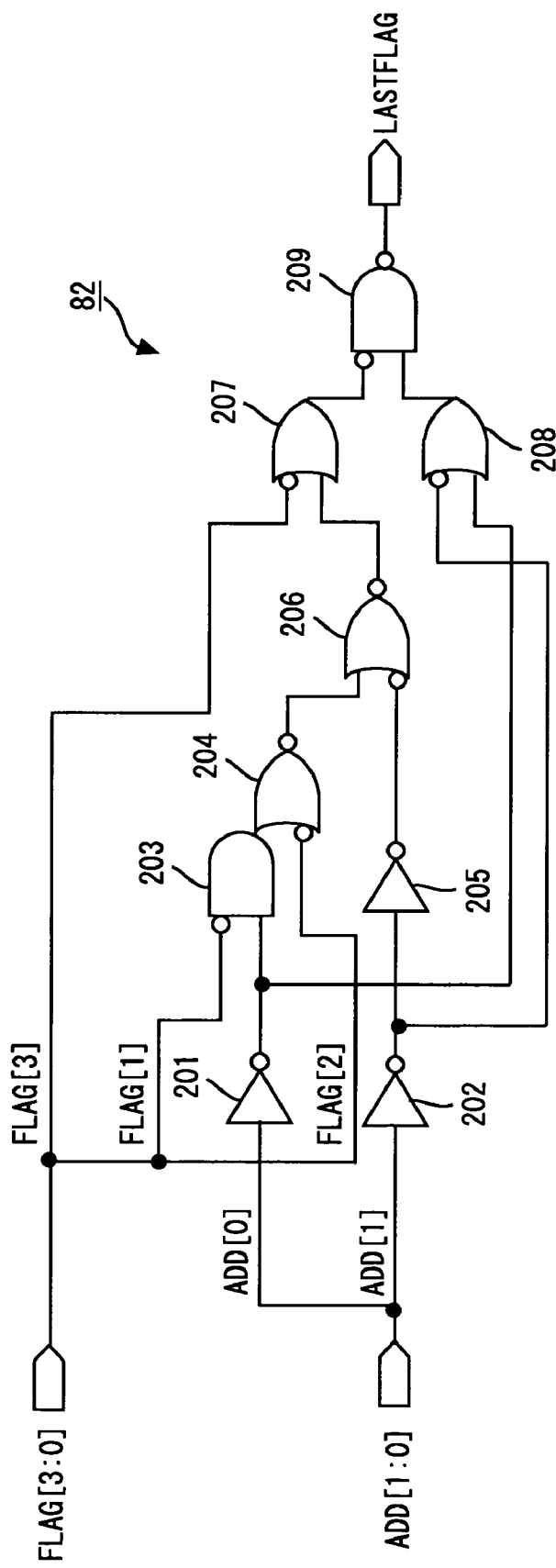
FIG. 14 is a circuit diagram showing the structure of a last address calculator of a nonvolatile semiconductor memory according to an embodiment of the present invention.

Referring further to FIGS. 13 and 14, detailed circuit configurations of the next execution address calculator 81 and the last address calculator 82 are described hereinafter.

FIG. 13 shows an example of the circuit configuration of the next execution address calculator 81. This examples inputs the current internal address ADD[1:0], the write flag FLAG[3:0] and the initial set flag INITFLAG and outputs the next address NEXT_ADD[1:0].

As shown in FIG. 13, the next execution address calculator 81 is composed of a combinational circuit having logic gates denoted by 101 to 118, which includes an inverter, an AND gate, a NAND gate, an OR gate, a NOR gate and a buffer.

The initial set flag INITFLAG is inverted and input to one input terminal of the NAND gate 102. The write flag FLAG [0] is input to the other input terminal of the NAND gate 102. The write flag FLAG[1] is input to the input terminal of the inverter 103. The write flag FLAG[2] is input to the input terminal of the inverter 101. The write flag FLAG[3] is input to the input terminal of the inverter 105. The current address ADD[0] is input to the input terminal of the buffer 104. The current address ADD[1] is input to the input terminal of the buffer 106.

The outputs of the inverter 101, the NAND gate 102, the inverter 103, the buffer 104, the inverter 105 and the buffer 106 are input to the buffer 116 through the AND gate 107, the NOR gate 108, the OR gate 109, the AND gate 110, the AND gate 111 and the NOR gate 112. The output of the buffer 116 is the next address NEXT_ADD[1]. Further, the outputs of the inverter 101, the NAND gate 102, the inverter 103, the buffer 104, the inverter 105 and the buffer 106 are input to the NOR gate 118 through the AND gate 107, the NOR gate 108, the OR gate 109, the AND gate 110, the AND gate 111, the NOR gate 112, and further through the AND gate 113, the NOR gate 114, the NAND gate 115 and the AND gate 117. The output of the NOR gate 118 is the next address NEXT_ADD[0].

The following Table 1 is a truth table that indicates the inputs and the outputs in the next execution address calculator 81 shown in FIG. 13.

TABLE 1

| INPUT | | | OUTPUT |
|---|---|---|---|
| CURRENT ADDRESS | WRITE FLAG | INITIAL SET FLAG | NEXT ADDRESS |
| (00)b | [0] == (1)b | (1)b | (00)b |
| (00)b | [1] == (1)b | (0)b | (01)b |
| (00)b | [1] == (0)b && [2] == (1)b | (0)b | (10)b |
| (00)b | [1] == (0)b && [2] == (0)b && [3] == (1)b | (0)b | (11)b |
| (01)b | [2] == (1)b | (0)b | (10)b |
| (01)b | [2] == (0)b && [3] == (1)b | (0)b | (11)b |
| (10)b | [3] == (1)b | (0)b | (11)b |
| (11)b | — | (0)b | (11)b |

Table 1 shows the same operation as in the flowchart of FIG. 11. For example, when the input is the current internal address ADD[1:0]=(00)b, the write flag FLAG[0]=1 and the initial set flag INITFLAG=1, the next execution address calculator 81 outputs the next address NEXT_ADD[1:0]=(00)b.

When the input is the current internal address ADD[1:0]=(00)b, the write flag FLAG[1]=0, the write flag FLAG[2]=0, the write flag FLAG[3]=1 and the initial set flag INITFLAG=0, the next execution address calculator 81 outputs the next address NEXT_ADD[1:0]=(11)b. At this time, it selects the internal address (11)b, not selecting the internal address (01)b or (10)b.

When the input is the current internal address ADD[1:0]=(01)b, the write flag FLAG[2]=0, the write flag FLAG[3]=1 and the initial set flag INITFLAG=0, the next execution address calculator 81 outputs the next address NEXT_ADD[1:0]=(11)b. At this time, it selects the internal address (11)b, not selecting the internal address (10)b.

The circuit of FIG. 13 may be composed of another combinational circuit as long as it operates as shown in Table 1.

FIG. 14 shows an example of the circuit configuration of the last address calculator 82. This examples inputs the current internal address ADD[1:0], the write flag FLAG[3:0] and outputs the last address flag LASTFLAG.

As shown in FIG. 14, the last address calculator 82 is composed of a combinational circuit having logic gates denoted by 201 to 209, which includes an inverter, an AND gate, a NAND gate, an OR gate, and a NOR gate.

The write flag FLAG[0] is not input since the last address calculator 82 does not use it. The write flag FLAG[1] is inverted and input to one input terminal of the AND gate 203. The write flag FLAG[2] is input to one input terminal of the NOR gate 204. The write flag FLAG[3] is input to the input terminal of the OR gate 207. The current address ADD[0] is input to the input terminal of the inverter 201. The current address ADD[1] is input to the input terminal of the inverter 202.

The inputs are input to the NAND gate 209 through the inverter 201, the inverter 202, the AND gate 203, the NOR gate 204, the inverter 205, the NOR gate 206, the OR gate 207 and the OR gate 208. The output of the NAND gate 209 is the last address flag LASTFLAG.

The following Table 2 is a truth table that indicates the inputs and the outputs in the last address calculator 82 shown in FIG. 14.

TABLE 2

| INPUT | | OUTPUT LAST ADDRESS FLAG |
|---|---|---|
| CURRENT ADDRESS | WRITE FLAG | |
| (00)b | [1] == (0)b && [2] == (0)b && [3] == (0)b | (1)b |
| (00)b | [1] == (1)b \|\| [2] == (1)b \|\| [3] == (1)b | (0)b |
| (01)b | [2] == (0)b && [3] == (0)b | (1)b |
| (01)b | [2] == (1)b \|\| [3] == (1)b | (0)b |
| (10)b | [3] == (0)b | (1)b |
| (10)b | [3] == (1)b | (0)b |
| (11)b | — | (1)b |

Table 2 shows the same operation as in the flowchart of FIG. 12. For example, when the input is the current internal address ADD[1:0]=(00)b, the write flag FLAG[1]=0, the write flag FLAG[2]=0 and the write flag FLAG[3]=0, the last address calculator 82 outputs the last address flag LASTFLAG=1. At this time, it selects the internal address (00)b as the last address, not selecting the internal address (01)b, (10)b or (11)b.

When the input is the current internal address ADD[1:0]=(01)b, the write flag FLAG[2]=0 and the write flag FLAG[3]=0, the last address calculator 82 outputs the last address flag LASTFLAG=1. At this time, it selects the internal address (01)b as the last address, not selecting the internal address (10)b or (11)b.

When the input is the current internal address ADD[1:0]=(10)b and the write flag FLAG[3]=0, the last address calculator 82 outputs the last address flag LASTFLAG=1. At this time, it selects the internal address (10)b as the last address, not selecting the internal address (11)b.

The circuit of FIG. 14 may be composed of another combinational circuit as long as it operates as shown in Table 2.

A calculation example of an automatic write operation time according to the first and the second embodiment is described hereinafter. The calculation is made under the condition where the number of write addresses in the buffer is 32 bits for the cases where the memory cell of the flash memory is multivalued and where it is binary. In the case of using the multivalued flash memory, the write operation ends in 30 times of writing and an electrical write pulse width is 500 ns. In the case of using the binary flash memory, the write operation ends in one time of writing and an electrical write pulse width is 2 us.

In this example, the automatic writing time is calculated in the sequence operation expressed by the following expressions. Expressions 1 to 3 below respectively represents a processing time for pre-verify, program (writing) and post-verify according to the first embodiment.

PreVerify=search(50 ns)*number of all addresses+ Verify(200 ns)*number of necessary addresses    Expression 1

Program=search(50 ns)*number of all addresses+ Program(XX ns)*number of necessary addresses    Expression 2

PostVerify=search(50 ns)*number of all addresses+
    Verify(200 ns)*number of necessary addresses.    Expression 3

Expressions 4 to 6 below respectively represents a processing time for pre-verify, program (writing) and post-verify according to the second embodiment.

PreVerify=search(50 ns)*number of necessary
    addresses+Verify(200 ns)*number of necessary
    addresses    Expression 4

Program=search(50 ns)*number of necessary
    addresses+Program($XX$ ns)*number of necessary
    addresses    Expression 5

PostVerify=search(50 ns)*number of necessary
    addresses+Verify(200 ns)*number of necessary
    addresses.    Expression 6

Table 3 below shows the result of calculating a processing time in a binary flash memory according to the above expressions when the number of write data segments is 4 to 32.

TABLE 3

| NUMBER OF WRITE DATA SEGMENTS | FIRST EMBODIMENT | | | SECOND EMBODIMENT | | | TIME REDUCTION EFFECT |
|---|---|---|---|---|---|---|---|
| | SEARCH TIME | VERIFY/ PROGRAM TIME | TOTAL | SEARCH TIME | VERIFY/ PROGRAM TIME | TOTAL | SECOND EMBODIMENT/FIRST EMBODIMENT |
| 32 | 4,800 | 76,800 | 81,600 | 4,800 | 76,800 | 81,600 | 0 | 100.0% |
| 16 | 4,800 | 38,400 | 43,200 | 2,400 | 38,400 | 40,800 | −2,400 | 94.4% |
| 8 | 4,800 | 19,200 | 24,000 | 1,200 | 19,200 | 20,400 | −3,600 | 85.0% |
| 4 | 4,800 | 9,600 | 14,400 | 600 | 9,600 | 10,200 | −4,200 | 70.8% |

As shown in Table 3, if the number of write data segments is 32, the data segments are stored entirely in the buffer 1 and therefore there is no difference in search time. Thus, a processing time is the same between the first embodiment and the second embodiment. Since a search time in the second embodiment decreases as the number of write data segments decreases, the overall processing time decreases accordingly. If the number of write data segments is 4, a processing time in the second embodiment is 70.8% of a processing time in the first embodiment.

Table 4 below shows the result of calculating a processing time in a multivalued flash memory according to the above expressions when the number of write data segments is 4 to 32.

write data segments decreases, since the second embodiment can eliminate the unnecessary address selection process to reduce a search time, the overall processing time decreases accordingly, thus increasing the time reduction effect. For example, in the case of the binary flash memory, if the number of write data segments is 4, the processing time in the first embodiment is 14.4 us while the processing time in the second embodiment is 10.2 us, such that the processing time in the second embodiment is 70.8% of the processing time in the first embodiment.

Since the number of retrying the electrical writing and the number of addresses for which the writing is unnecessary is larger in the multivalued flash memory than in the binary flash memory, the effect of increasing the processing speed is more significant in the multivalued flash memory.

For example, if the calculation formula is expressed for the case where the number of write data segments is 4 when using the multivalued flash memory, the processing time in the first embodiment may be represented by the following Expressions 7 to 10:

PreVerify=(50 ns*32addresses)+(200 ns*4addresses)
    =2.4 us    Expression 7

Program=(50 ns*32addresses)+(500 ns*4addresses)
    =3.6 us    Expression 8

PostVerify=(50 ns*32addresses)+(200 ns*4addresses)
    =2.4 us    Expression 9

Total=(Expression7)+(Expression8+Expression9)
    *30=182.4 us.    Expression 10

TABLE 4

| NUMBER OF WRITE DATA SEGMENTS | FIRST EMBODIMENT | | | SECOND EMBODIMENT | | | TIME REDUCTION EFFECT |
|---|---|---|---|---|---|---|---|
| | SEARCH TIME | VERIFY/ PROGRAM TIME | TOTAL | SEARCH TIME | VERIFY/ PROGRAM TIME | TOTAL | SECOND EMBODIMENT/FIRST EMBODIMENT |
| 32 | 97,600 | 678,400 | 776,000 | 97,600 | 678,400 | 776,000 | 0 | 100.0% |
| 16 | 97,600 | 339,200 | 436,800 | 48,800 | 339,200 | 388,000 | −48,800 | 88.8% |
| 8 | 97,600 | 169,600 | 267,200 | 24,400 | 169,600 | 194,000 | −73,200 | 72.6% |
| 4 | 97,600 | 84,800 | 182,400 | 12,200 | 84,800 | 97,000 | −85,400 | 53.2% |

Figure 15:
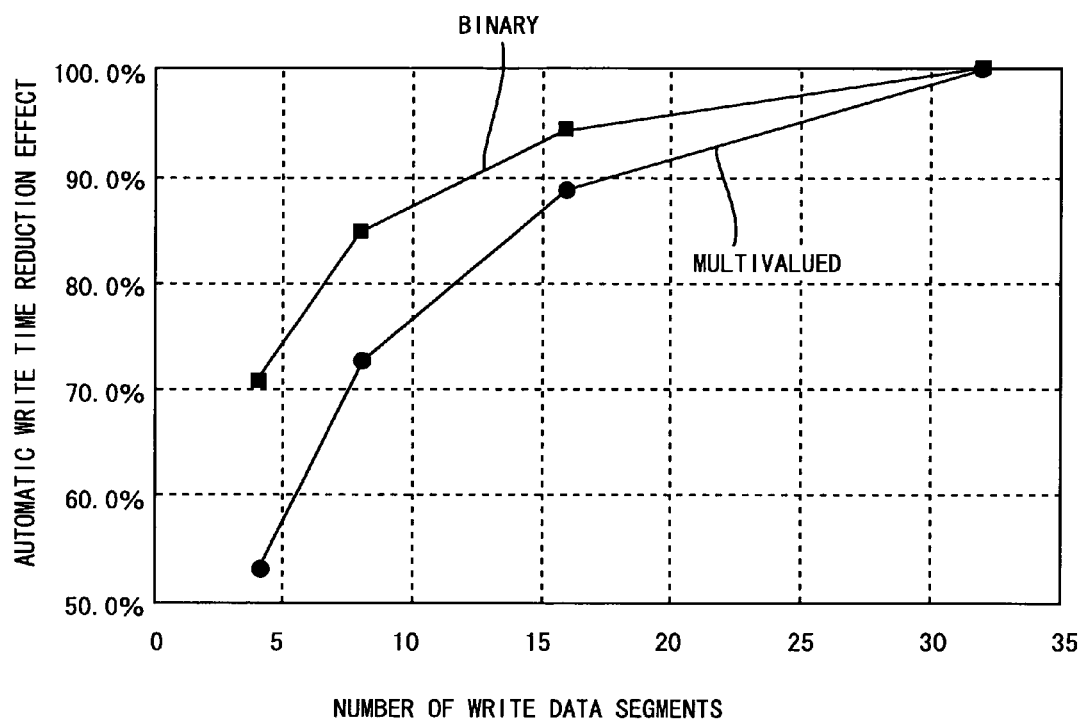
FIG. 15 is a graph showing a calculation example of a write operation time according to a first and a second embodiment of the present invention.

FIG. 15 shows the graph of the time reduction effect in Tables 3 and 4. As shown in Tables 3 and 4 and FIG. 15, if the number of write data segments is 32, the data segments are stored entirely in the buffer 1 and therefore there is no difference in search time. Thus, a processing time is the same between the first embodiment and the second embodiment, and no time reduction effect is obtained. As the number of The calculation result of the processing time in the second embodiment under the same conditions is as represented by the following Expressions 11 to 14:

PreVerify=(50 ns*4addresses)+(200 ns*4addresses)
    =1.0 us    Expression 11

Program=(50 ns*4addresses)+(500 ns*4addresses)
    =2.2 us    Expression 12

$$\text{PostVerify} = (50 \text{ ns} * 4 \text{addresses}) + (200 \text{ ns} * 4 \text{addresses})$$
$$= 1.0 \text{ us} \quad \text{Expression 13}$$

$$\text{Total} = (\text{Expression11}) + (\text{Expression12} + \text{Expression13})$$
$$*30 = 97.0 \text{ us.} \quad \text{Expression 14}$$

Accordingly, the processing time in the first embodiment is 182.4 us and the processing time in the second embodiment is 97.0 us. Thus, the processing time in the second embodiment is reduced to 53.2% of the processing time in the first embodiment.

As described in the foregoing, in the process of searching for the address to be verified or written, this embodiment does not sequentially select all addresses as in the first embodiment but selects only the addresses for which the write flag is set. This eliminates the unnecessary address selection operation and therefore reduces the processing time for the write operation, thus increasing the write operation speed.

Further, if a multivalued flash memory is used for the memory cell to which data is to be written, the number of retrying times increases and thus the number of times of performing the address selection operation increases accordingly, thus enabling a further increase in the processing speed.

Furthermore, if unnecessary voltage application occurs in the memory cell array when selecting an address, the use of this embodiment enables the prevention of the application of an unnecessary electrical stress.

Third Embodiment

The nonvolatile semiconductor memory according to the third embodiment of the present invention is described hereinafter. The nonvolatile semiconductor memory of this embodiment is the same as that of the second embodiment except for the next address calculator 8. Thus, the structure is not described in detail herein.

The second embodiment requires the comparison operation with a relatively large number of stages. For example, if the internal address is 2 bits, the circuit configurations of the next execution address calculator 81 and the last address calculator 82 are as shown in FIGS. 13 and 14. As the number of bits of the internal address increases, the circuit configuration becomes more complicated. Thus, the comparison operation can be too late depending on the circuit operation specification.

In order to overcome this drawback, the present embodiment divides the process of the next execution address calculator 81 shown in the flowchart of FIG. 11 and the process of the last address calculator 82 shown in the flowchart of FIG. 12 included in the next address calculator 8 into a plurality of stages. Further, it provides a selector in the final stage so as to select and output a necessary operation result.

Figure 16:
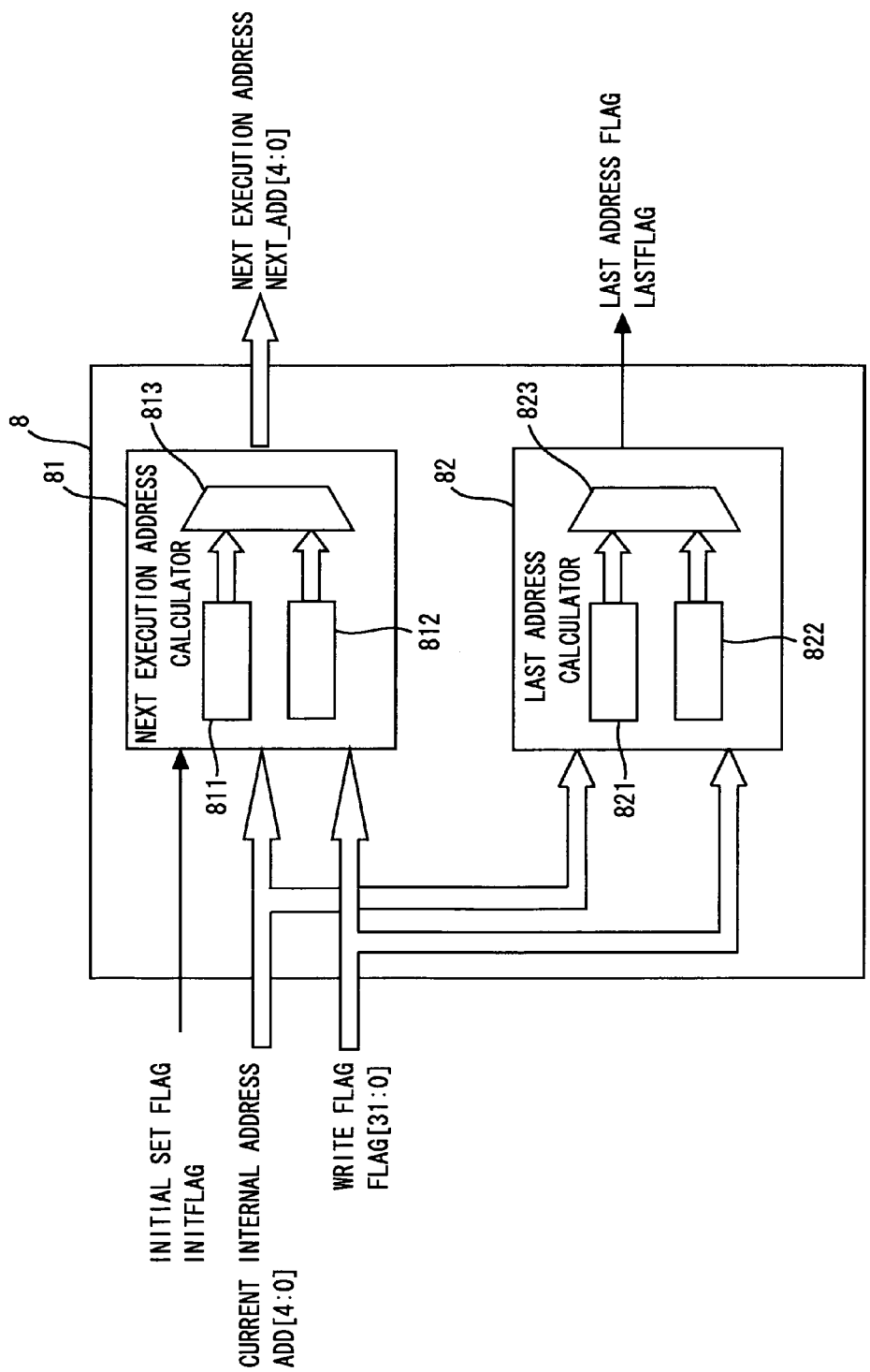
FIG. 16 is a block diagram showing the structure of a next address calculator of a nonvolatile semiconductor memory according to an embodiment of the present invention.
Figure 17:
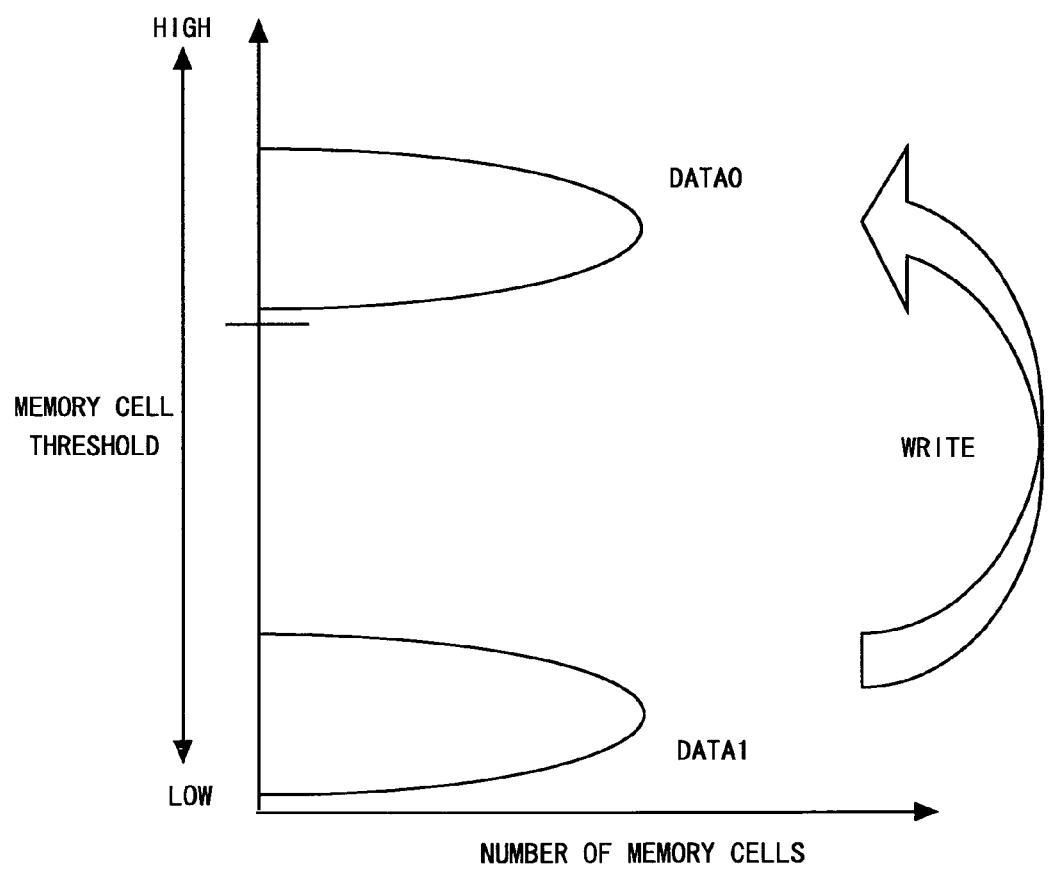
FIG. 17 is a graph showing a change in a threshold of a memory cell in a typical binary flash memory.
Figure 18:
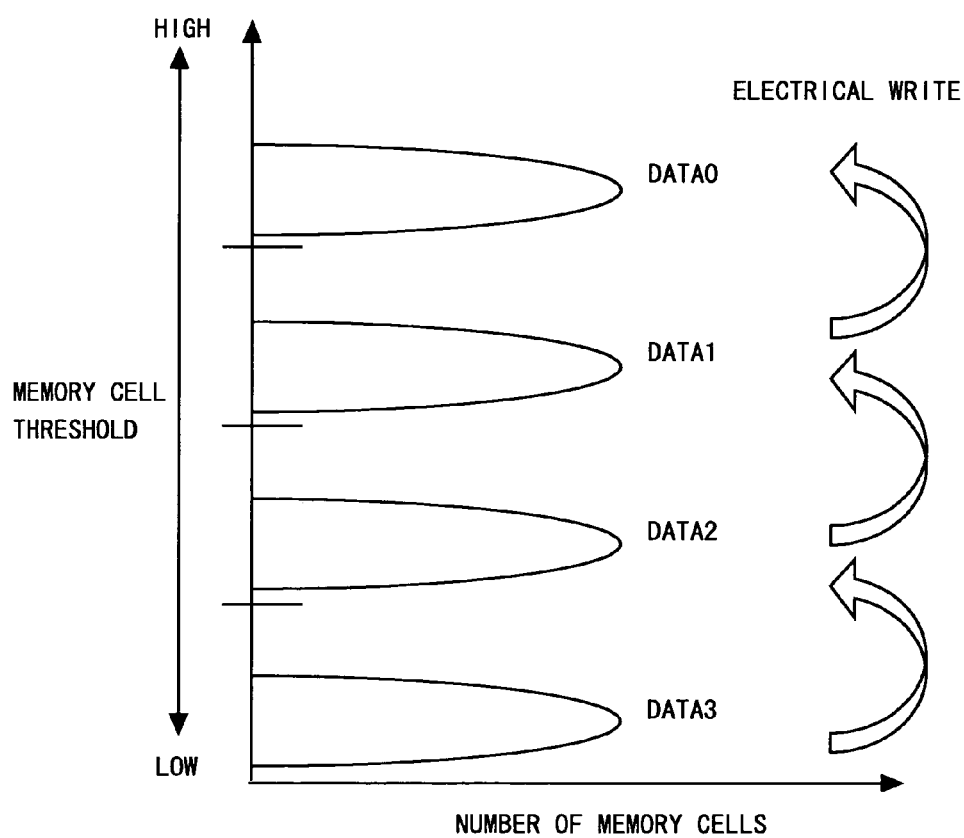
FIG. 18 is a graph showing a change in a threshold of a memory cell in a typical multivalued flash memory.
Figure 19:
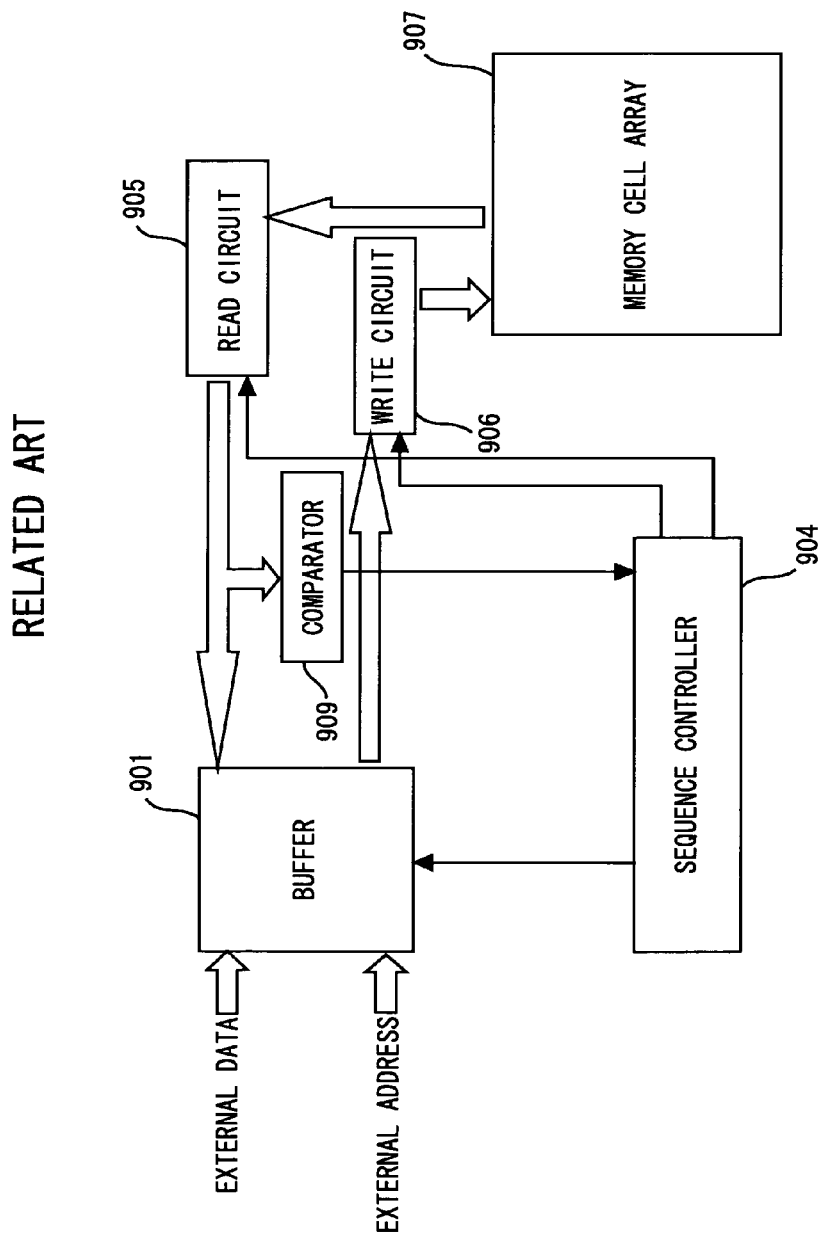
FIG. 19 is a block diagram showing the structure of a nonvolatile semiconductor memory of a related art.
Figure 20:
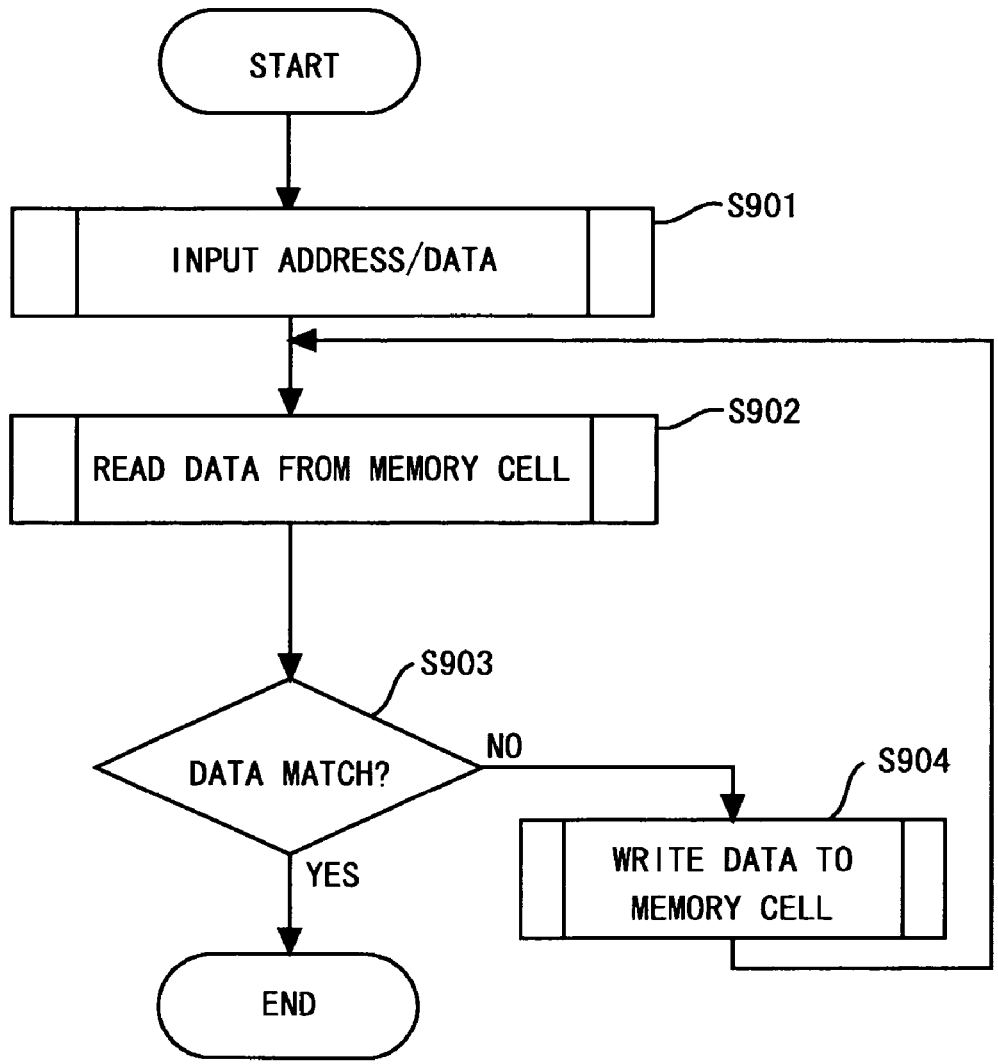
FIG. 20 is a flowchart showing write operation of a nonvolatile semiconductor memory of a related art.

FIG. 16 is a block diagram showing the case of dividing the process into two stages, for example. In the next execution address calculator 81, the process is divided into a first next execution address calculator 811 and a second next execution address calculator 812. For example, in the flowchart of FIG. 11, the determination on the write flags FLAG[0] to FLAG[15] is implemented by the first next execution address calculator (first next execution address selector) 811 and the determination on the write flags FLAG[16] to FLAG[31] is implemented by the second next execution address calculator (second next execution address selector) 812. Finally, a selector (first determinator) 813 selects either one of the address calculated by the first next execution address calculator 811 or the address calculated by the second next execution address calculator 812 and outputs the result.

Similarly, in the last address calculator 82, the process is divided into a first last address calculator 821 and a second last address calculator 822. The determination on the current internal address ADD[4:0]=(0)d to (15)d in the flowchart of FIG. 12 is implemented in the first last address calculator (first last address determinator) 821 and the determination on the current internal address ADD[4:0]=(16)d to (315)d is implemented in the second last address calculator (second last address determinator) 822. Finally, a selector (second determinator) 823 selects either one of the last address flag determined by the first last address calculator 821 or the last address flag determined by the second last address calculator 822 and outputs the result.

As described in the foregoing, this embodiment divides the calculation processing of the next address calculator into a plurality of circuits, thereby further increasing the write operation speed. It is thereby possible to obtain a sufficiently high operation speed even when the number of addresses in the buffer increases or when the calculation processing time of the next address calculator does not satisfy the circuit operation specification.

Other Embodiments

Although the address selection operation in the above-described embodiments selects the address in the ascending order from the top address to the last address, it is not limited thereto. The operation may select the address in the descending order, which has the same effects. Thus, the present invention may be applied to the case where the address should be selected in the descending order due to the configuration of the memory cell array, for example, without the reduction of the effects.

Further, through the data write operation to the memory cell is mainly described in the above embodiments, it is not limited thereto and the present invention may be applied to the data erase operation. In the data erase operation, the above-described address selection is implemented in the write operation before erasing, the erase operation, the write-back operation and the read operation for each of these operations, and it is possible to reduce the erase operation time.

It is apparent that the present invention is not limited to the above embodiment that may be modified and changed without departing from the scope and spirit of the invention.

What is claimed is:

1. A nonvolatile semiconductor memory that performs write/erase operation in units of data block containing a plurality of data segments, comprising:
    a memory cell array including a plurality of nonvolatile memory cells;
    a flag storage storing a flag provided for each address and indicating success/failure of the write/erase operation in association with each address of the plurality of data segments contained in the data block;
    an address selector selecting the address where the write/erase operation has failed according to the stored flag;
    a writing/erasing section performing the write/erase operation of the data segments on the nonvolatile memory cell located in the selected address;
    a verify section performing verify operation to verify success/failure of the data write/erase operation on the nonvolatile memory cell located in the selected address; and
    a flag update section updating the flag according to a result of the verify operation,
    wherein the address selector includes a next execution address calculator that checks a plurality of flags stored in the flag storage at substantially the same time in each data write/erase operation or verify operation and selects an address of a set flag from the plurality of flags, and wherein the next execution address calculator includes a first and a second next execution address calculator and a first determinator determining one from addresses selected by the first and the second next execution address calculators, the first next execution address calculator checking a plurality of flags corresponding to addresses of a first range and the second next execution address calculator checking a plurality of flags corresponding to addresses of a second range.

2. A nonvolatile semiconductor memory that performs write/erase operation in units of data block containing a plurality of data segments, comprising:

a memory cell array including a plurality of nonvolatile memory cells;

a flag storage storing a flag provided for each address and indicating success/failure of the write/erase operation in association with each address of the plurality of data segments contained in the data block;

an address selector selecting the address where the write/erase operation has failed according to the stored flag;

a writing/erasing section performing the write/erase operation of the data segments on the nonvolatile memory cell located in the selected address;

a verify section performing verify operation to verify success/failure of the data write/erase operation on the nonvolatile memory cell located in the selected address; and a flag update section updating the flag according to a result of the verify operation, wherein the address selector includes a next execution address calculator that checks a plurality of flags stored in the flag storage at substantially the same time in each data write/erase operation or verify operation and selects an address of a set flag from the plurality of flags, and wherein the address selector further includes a last address calculator that checks a plurality of flags stored in the flag storage at substantially the same time upon selection of the address and determines completion of the data write/erase operation or the verify operation when all of the plurality of flags are not set.

3. The nonvolatile semiconductor memory according to claim 2, wherein the last address calculator checks a plurality of flags corresponding to addresses larger than a currently selected address.

4. The nonvolatile semiconductor memory according to claim 2, wherein the last address calculator includes a first and a second last address calculator and a determinator determining completion of the data write/erase operation or the verify operation based on one selected from determinations by the first and the second last address calculators, the first last address calculator checking a plurality of flags corresponding to addresses of a first range and the second last address calculator checking a plurality of flags corresponding to addresses of a second range.

* * * * *